(12) United States Patent
Renaud et al.

(10) Patent No.: US 12,538,512 B2
(45) Date of Patent: Jan. 27, 2026

(54) SEMICONDUCTOR DEVICE WITH CURRENT-CARRYING ELECTRODES AND A CONDUCTIVE ELEMENT AND METHOD OF FABRICATION THEREFOR

(71) Applicant: NXP USA, INC., Austin, TX (US)

(72) Inventors: Philippe Renaud, Chandler, AZ (US); Bernhard Grote, Phoenix, AZ (US); Bruce McRae Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 619 days.

(21) Appl. No.: 17/450,879

(22) Filed: Oct. 14, 2021

(65) Prior Publication Data

US 2023/0124686 A1 Apr. 20, 2023

(51) Int. Cl.
*H10D 30/47* (2025.01)
*H10D 30/01* (2025.01)
*H10D 64/00* (2025.01)
*H10D 64/01* (2025.01)

(52) U.S. Cl.
CPC ......... *H10D 30/475* (2025.01); *H10D 30/015* (2025.01); *H10D 64/01* (2025.01); *H10D 64/111* (2025.01)

(58) Field of Classification Search
CPC . H01L 29/7786; H01L 29/402; H01L 29/404; H01L 29/407; H01L 29/66462; H01L 29/42312; H01L 29/42316; H01L 29/4232
See application file for complete search history.

(56) References Cited

U.S. PATENT DOCUMENTS

| | | | |
|---|---|---|---|
| 6,939,781 B2 | 9/2005 | Redd et al. | |
| 7,812,369 B2 | 10/2010 | Chini et al. | |
| 8,283,699 B2 | 10/2012 | Wu | |
| 8,404,508 B2 | 3/2013 | Lidow et al. | |
| 9,024,324 B2 | 5/2015 | Teplik et al. | |
| 9,040,398 B2 | 5/2015 | Saxler et al. | |
| 9,741,840 B1 | 8/2017 | Moens et al. | |
| 2008/0128752 A1* | 6/2008 | Wu | H10D 30/015 257/E29.127 |

(Continued)

OTHER PUBLICATIONS

U.S. Appl. No. 18/298,815; Inventor: Jie Hu; "Semiconductor Device With Diffusion Barrier Layer And Method Of Fabrication Therefor;", filed Apr. 11, 2023.

(Continued)

*Primary Examiner* — Chad M Dicke
*Assistant Examiner* — Jeremy Daniel Watts
(74) *Attorney, Agent, or Firm* — Bruce M. Green

(57) ABSTRACT

An embodiment of a semiconductor device includes a semiconductor substrate, a first dielectric layer, a first current-carrying electrode, and a second current-carrying electrode are formed over the semiconductor substrate. The first current-carrying electrode and the second current-carrying electrode include a first conductive layer formed within first openings formed in the first dielectric layer. A control electrode is formed over the semiconductor substrate between the first current-carrying electrode and the second current-carrying electrode. A first conductive element that includes the first conductive layer is formed over the first dielectric layer, adjacent to the control electrode, and between the control electrode and the second current-carrying electrode.

24 Claims, 15 Drawing Sheets

(56) References Cited

U.S. PATENT DOCUMENTS

| | | | |
|---|---|---|---|
| 2015/0060948 A1* | 3/2015 | Kawai | H10D 30/015 |
| | | | 257/194 |
| 2015/0187685 A1* | 7/2015 | Preuss | H01L 23/49562 |
| | | | 174/250 |
| 2017/0133496 A1 | 5/2017 | Tsai et al. | |
| 2018/0342598 A1 | 11/2018 | Tsai et al. | |
| 2019/0245080 A1* | 8/2019 | Singh | H10D 62/126 |
| 2020/0176389 A1* | 6/2020 | Huang | H01L 23/53295 |
| 2020/0194578 A1* | 6/2020 | Ramaswamy | H10D 30/4732 |
| 2021/0336043 A1 | 10/2021 | Birner et al. | |
| 2022/0085176 A1* | 3/2022 | Shinohara | H10D 64/117 |
| 2023/0187529 A1* | 6/2023 | Kawashima | H10D 62/8503 |
| | | | 257/183 |

OTHER PUBLICATIONS

Non Final Office Action; U.S. Appl. No. 18/298,815; 22 pages (Sep. 8, 2025).

* cited by examiner

SEMICONDUCTOR DEVICE WITH CURRENT-CARRYING ELECTRODES AND A CONDUCTIVE ELEMENT AND METHOD OF FABRICATION THEREFOR

TECHNICAL FIELD

Embodiments of the subject matter described herein relate generally to semiconductor devices with conductive elements and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to enhance the performance and reliability of high frequency transistors. Accordingly, there is a need for semiconductor and, in particular, GaN devices with field plates.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
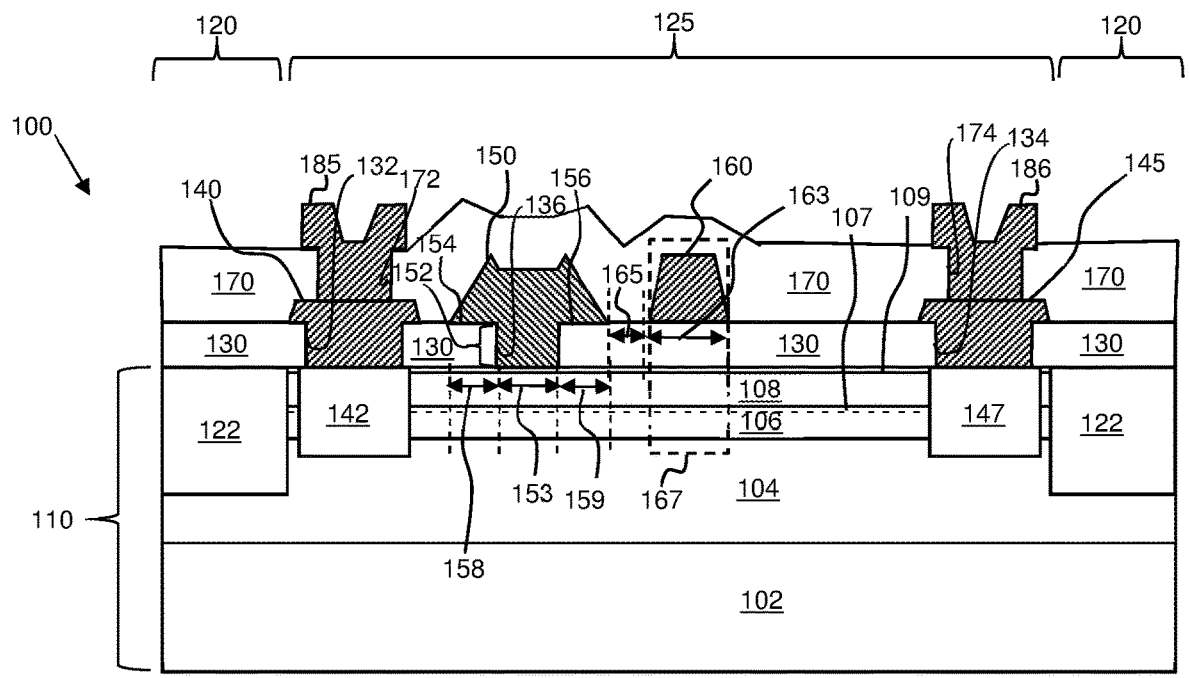
FIG. 1 is a cross-sectional, side view of an exemplary GaN heterojunction field effect transistor (HFET) in accordance with an embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

In one aspect, a semiconductor device may include a semiconductor substrate that includes an upper surface and a channel. A first dielectric layer may be disposed over the upper surface of the semiconductor substrate, in accordance with an embodiment. A first current-carrying electrode and a second current-carrying electrode that includes a first conductive layer may be formed over the semiconductor substrate within first openings formed in the first dielectric layer, wherein the first current-carrying electrode and the second current-carrying electrode may be electrically coupled to the channel, according to an embodiment. In an embodiment, a control electrode may be formed over the semiconductor substrate and disposed between the first current-carrying electrode and the second current-carrying electrode, wherein the control electrode may be electrically coupled to the channel. A first conductive element that includes the first conductive layer may be formed over the first dielectric layer, adjacent to the control electrode, and between the control electrode and the second current-carrying electrode, according to an embodiment.

In another aspect, an embodiment may include a gallium nitride field effect transistor device that may include a semiconductor substrate comprising gallium nitride that may include an upper surface and a channel. A first dielectric layer may be disposed over the upper surface of the semiconductor substrate, according to an embodiment. In an embodiment, a source electrode and a drain electrode may include a first conductive layer and may be formed over the semiconductor substrate within openings formed in the first dielectric layer, wherein the source electrode and the drain electrode may be electrically coupled to the channel. A gate electrode may be formed over the semiconductor substrate and disposed between the source electrode and the drain electrode, wherein the gate electrode may be electrically coupled to the channel, according to an embodiment. In an embodiment, a first field plate that includes the first conductive layer may be formed over the first dielectric layer, adjacent to the gate electrode between the gate electrode and the drain electrode, wherein the first field plate may form a first metal-insulator-semiconductor region in a vertical region between the gate electrode and the first field plate that may include the first field plate, the first dielectric layer, and the semiconductor substrate.

In still another aspect, the inventive subject matter may include a method of fabricating a gallium nitride heterojunction field effect transistor device. The method may include forming a semiconductor substrate comprising gallium nitride, an upper surface, and a channel, according to an embodiment. In an embodiment, the method may include forming a first dielectric layer over the upper surface of the semiconductor substrate. The method may include forming a source electrode and a drain electrode over the semiconductor substrate using a first conductive layer within openings formed in the first dielectric layer, according to an embodiment. In an embodiment, the method may include forming a first field plate using the first conductive layer over the first dielectric layer, between the source electrode and the drain electrode. According to an embodiment, the method may include forming a gate electrode over the semiconductor substrate and between the source electrode and at least a portion of the first field plate, wherein the gate electrode is electrically coupled to the channel.

FIG. 1 is a cross-sectional, side view of an exemplary GaN heterojunction field effect transistor (HFET) device 100 in accordance with an embodiment. In an embodiment, the GaN HFET device 100 may include a semiconductor substrate 110, one or more isolation regions 120, an active region 125, a first dielectric layer 130, a source electrode (i.e., "first current-carrying electrode") 140, a drain electrode (i.e., "second current-carrying electrode") 145, a gate electrode 150 (i.e., "control electrode"), a first field plate electrode (i.e., "first conductive element") 160, and a second dielectric layer 170. As is described more fully below, the GaN HFET device 100 is substantially contained within the active region 125 defined by the isolation regions 120, with the first dielectric layer 130, the source electrode 140, drain electrode 145, gate electrode 150, and first field plate 160 disposed over the semiconductor substrate 110.

In an embodiment, the semiconductor substrate 110 may include a host substrate 102, a buffer layer 104 disposed over the host substrate 102, a channel layer 106 disposed over the buffer layer 104, a barrier layer 108 disposed over the channel layer 106, and a cap layer 109 disposed over the channel layer 106. In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AlN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 may be grown epitaxially over the host substrate 102. The buffer layer 104 may include at least one AlGaN mixed crystal layer having a composition denoted by $Al_xGa_{1-x}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment may include a buffer layer 104 disposed over the host substrate and nucleation layer (not shown). The buffer layer 104 may include additional $Al_xGa_{1-x}N$ layers. The thickness of the additional $Al_xGa_{1-x}N$ layer(s) may be between about 200 angstroms and about 50,000 angstroms though other thicknesses may be used. In an embodiment, the additional $Al_xGa_{1-x}N$ layers may be configured as GaN (X=0) where the $Al_xGa_{1-x}N$ is not intentionally doped (NID). The additional $Al_xGa_{1-x}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_xGa_{1-x}N$ layers may be configured with X=0.01 to 0.10 where the $Al_xGa_{1-x}N$ is NID or, alternatively, where the $Al_xGa_{1-x}N$ is intentionally doped with Fe, Cr, C, or other suitable dopant species. In other embodiments (not shown), the additional layers may be configured as a superlattice where the additional layers include a series of alternating NID or doped $Al_xGa_{1-x}N$ layers where the value of X takes a value between 0 and 1. In still other embodiments, the buffer layer 104 may also include one or more indium gallium nitride (InGaN) layers, with composition denoted $In_yGa_{1-y}N$, where Y, the indium mole fraction, may take a value between 0 and 1. The thickness of the InGaN layer(s) may be between about 50 angstroms and about 2000 angstroms, though other thicknesses may be used.

In an embodiment, a channel layer 106 may be formed over the buffer layer 104. The channel layer 106 may include one or more group III-N semiconductor layers and may be supported by the buffer layer 104. The channel layer 106 may include an $Al_xGa_{1-x}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$ though other higher or lower concentrations may be used. In other embodiments, the channel layer 106 may include NID or doped $In_yGa_{1-y}N$, where Y, the indium mole fraction, may take a value between 0 and 1.

A barrier layer 108 may be formed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 1000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In an embodiment illustrated in FIG. 1, a cap layer 109 may be formed over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments, the cap layer 109 may be omitted (not shown). In other embodiments using N-polar materials, the channel layer 106 may be disposed over the barrier layer 108 to create a 2-DEG and channel 107 directly beneath the cap layer 109 and the gate electrode 150 (not shown). Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 125 above and along the upper surface 103 of the host substrate 102, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 125. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 125 "mesas" surrounded by high resistivity or semi-insulating isolation regions 120 (not shown). In still other embodiments, the isolation regions 120 may be formed by removing one or more of the epitaxial and/or other semiconductor layers of the semiconductor substrate 110 and then using ion implantation to damage and further enhance the semi-insulating properties of the remaining layers of the semiconductor substrate 110 and leaving behind active region 125 "mesas" surrounded by high resistivity or semi-insulating isolation regions 120 that have been implanted (not shown). In an embodiment, a first dielectric layer 130 may be formed over the active region 125 and isolation regions 120. In an embodiment, the first dielectric layer 130 may be formed from one or more suitable materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. In an embodiment, the first dielectric layer 130 may have a thickness of between 200 angstroms and 1000 angstroms. In other embodiments, the first dielectric layer 130 may have a thickness of between 50 angstroms and 10000 angstroms, though other thicknesses may be used.

In an embodiment, the source electrode 140 and the drain electrode 145 may be formed over and contact source and drain regions 142, 147 formed in semiconductor substrate 110 in the active region 125. The source electrode 140 and the drain electrode 145 may be formed inside a source opening 132 and a drain opening 134 (i.e., "first openings") formed in the first dielectric layer 130 and may be formed from a first conductive layer. In some embodiments, ion implantation may be used to form ohmic contact to the channel 107 to create source and drain regions 142, 147. In an embodiment, the one or more conductive layers (i.e., "first conductive layer") used to form source and drain electrodes 140, 145 may include titanium (Ti), gold (Au), Al, molybdenum (Mo), nickel (Ni), Si, Ge, platinum (Pt), tantalum (Ta), or other suitable materials. In other embodiments, the one or more conductive layers used to form source and drain electrodes 140, 145 may include titanium-tungsten (TiW), titanium-aluminum (TiAl), or titanium-tungsten nitride (TiWN). In an embodiment, the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108. In an embodiment, the source electrode 140 and the drain electrode 145 may be formed from a multi-layer stack. In an embodiment, the multi-layer stack used to form the source electrode 140 and the drain electrode 145 may include an adhesion layer and one or more layers, that when annealed, allows an ohmic contact to form between the channel 107 and the source and drain regions 142, 147. In an embodiment, the adhesion layer may include titanium (Ti), tantalum (Ta), silicon (Si), or other suitable materials. In an embodiment, the adhesion layer may have a work function that is below 4.5 electron-volts.

In an embodiment, the gate electrode 150 may be formed over the semiconductor substrate 110 in the active region 125. The gate electrode 150 may include a vertical stem 152, a first protruding region 154 coupled to the vertical stem 152 over the first dielectric layer 130 and toward the source electrode, according to an embodiment. In an embodiment a second protruding region 156 may couple to the vertical stem 152 and may be formed over the first dielectric layer 130 and toward the drain electrode 145. In an embodiment, the gate electrode 150 may be electrically coupled to the channel 107 through the cap layer 109 and the barrier layer 108. Changes to the electric potential applied to the gate electrode 150 may shift the quasi Fermi level for the barrier layer 108 with respect to the quasi Fermi level for the channel layer 106 and thereby modulate the electron concentration in the channel 107 within the semiconductor substrate 110 under the gate electrode 150. One or more Schottky materials such as Ni, Pd, Pt, iridium (Ir), or Copper (Cu), may be combined with one or more of low stress conductive materials such as Au, Al, Cu, poly Si, or other suitable material(s) in a metal stack to form a gate electrode 150 for a low-loss, Schottky gate electrode 150 electrically coupled to channel 107, according to an embodiment. In an embodiment, the gate electrode 150 may be formed, wherein the vertical stem 152 is formed within a gate opening 136 (i.e., "second opening") in the first dielectric layer 130.

In an embodiment, the gate electrode 150 may be characterized by a gate length 153 within the gate opening 136 and first and second protruding region lengths 158 and 159 where the first and second protruding regions 154 and 156 may overlay the first dielectric layer 130. In an embodiment, the gate length 153 may be between about 0.1 microns and about 1 micron. In other embodiments, the gate length 153 may be between about 0.02 microns and about 5 microns, though other suitable dimensions may be used. In an embodiment, the first protruding region length 158 may be between about 0.1 microns and about 0.5 microns. In other embodiments, the first protruding region length 158 may be between about 0.01 microns and 5 microns, though other suitable dimensions may be used. In an embodiment, a second protruding region length 159 may be between about 0.1 microns and about 0.5 microns. In other embodiments, the second protruding region length 159 may be between 0.1 microns and 2 microns, though other suitable lengths may be used.

Without departing from the scope of the inventive subject matter, numerous other embodiments may be realized. The exemplary embodiment of FIG. 1 depicts the gate electrode 150 as T-shaped with a vertical stem 152 and first and second protruding regions 154 and 156 disposed over the first dielectric layer 130. In other embodiments, the gate electrode 150 may be a square shape with no protruding regions (e.g., 154 and 156) over the first dielectric layers 130. In other embodiments (not shown), the gate electrode 150 may be recessed through the cap layer 109 and extend partially into the barrier layer 108, increasing the electrical coupling of the gate electrode 150 to the channel 107 through the barrier layer 108. In other embodiments (not shown), the cap layer 109 may be omitted and the gate electrode 150 may contact the barrier layer directly (not shown). In still other embodiments, the gate electrode 150 may be disposed over a gate dielectric that is formed between the gate electrode 150 and the semiconductor substrate 110 to form a metal-insulator semiconductor field effect transistor (MISFET) device (not shown).

In an embodiment, the first field plate 160 may be formed over the first dielectric layer, adjacent the gate electrode 150, and between the gate electrode 150 and the drain electrode 145. In an embodiment, the first field plate 160 may be formed using the first conductive layer, also used to form the source and drain electrodes 140, 145. The first field plate 160 may be characterized by a first field plate length 163 and by a field plate to gate distance 165 from the gate electrode 150, according to an embodiment. In an embodiment, the first field plate length 163 may be between about 0.2 microns and about 2 microns. In other embodiments, the first field plate length 163 may be between 0.1 microns and 4 microns, though other suitable lengths may be used. The first field plate to gate distance 165 may be between about 0.2 microns and about 1 micron. In other embodiments, the first field plate to gate distance 165 may be between about 0.1 microns and about 10 microns, though other suitable lengths may be used. A first metal-insulator-semiconductor region 167 may be created by the first field plate 160, the underlying first dielectric layer 130, and the semiconductor substrate 110. In an embodiment, the first metal-insulator-semiconductor region 167 may act as part of the active device and has a first threshold voltage, dependent on the thickness of the first dielectric layer 130 and the amount of charge in channel 107. In an embodiment the first threshold voltage may be between −5 volts and −15 V. In other embodiments, the threshold voltage may be between −4 volts and −50 volts. In an embodiment, the first field plate 160 may reduce the electric field and gate-drain feedback capacitance between the gate electrode 150 and the drain electrode 145.

In an embodiment, the second dielectric layer 170 may be disposed over the first dielectric layer 130, the source and drain electrodes 140 and 145, the gate electrode 150, and the first field plate 160. In an embodiment, the second dielectric layer 170 may include one or more of SiN, $SiO_2$, AlN, $HfO_2$, $Al_2O_3$, spin on glass, or other suitable insulating materials. In an embodiment, the second dielectric layer 170 may have a thickness of between about 500 angstroms and about 5000 angstroms. In other embodiments, the second dielectric layer 170 may have a thickness between about 100 angstroms and about 20000 angstroms.

In an embodiment, GaN HFET device 100 may be configured as a transistor finger wherein the source electrode 140, the drain electrode 145, gate electrode 150, and the first field plate 160 may be configured as elongated elements forming a gate finger. The GaN HFET device 100 may be defined, in part, by isolation regions 120 in which a gate width of the gate finger (i.e., a dimension extending along an axis perpendicular to the plane of GaN HFET device 100 of FIG. 1 is significantly larger than the gate length 153 of the gate electrode 150 (i.e., a dimension extending along an axis that is perpendicular to the width). In some embodiments, the gate width may be between about 50 microns and about 500 microns. In other embodiments, the gate width may be between about 5 microns and about 1000 microns. In an embodiment, the first field plate 160 may be electrically coupled to the same potential as the source electrode 140. The first field plate 160 may be connected to the source electrode 140 using connections formed from extensions of the conductive material used to form the first field plate 160 at one or more ends of device fingers in the isolation region 120 to the source electrode 140 (not shown).

Figure 2:
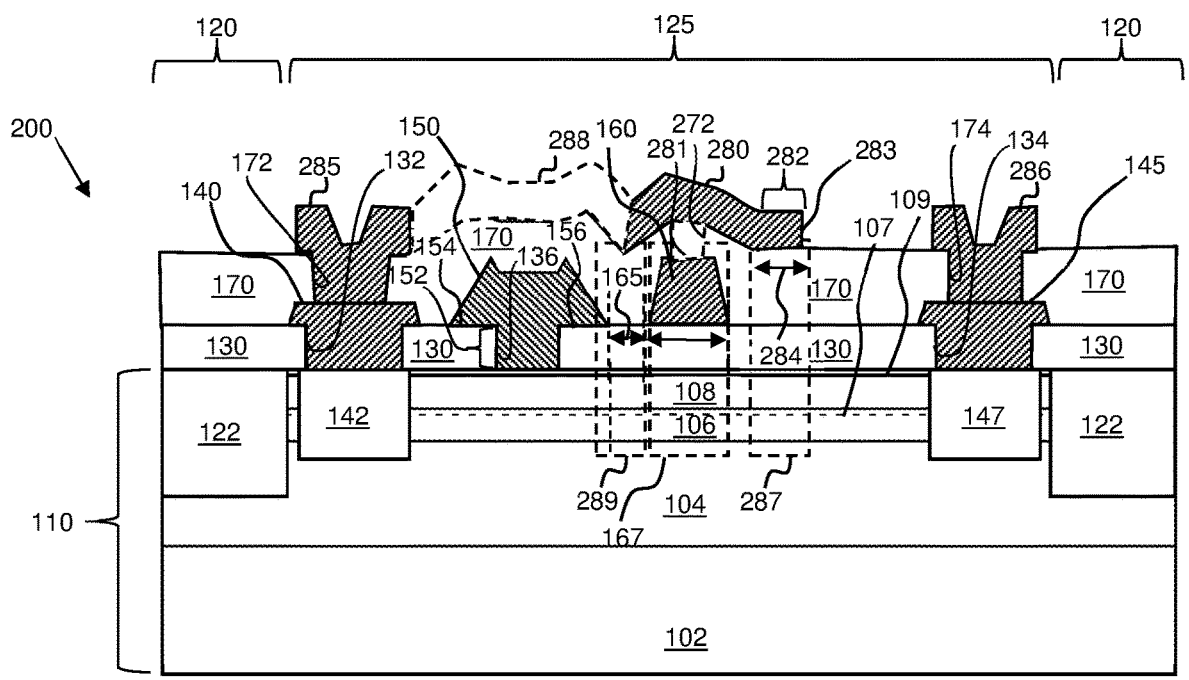
FIG. 2 is a cross-sectional, side view of an exemplary GaN heterojunction field effect transistor (HFET) in accordance with an embodiment.

FIG. 2 is a cross-sectional, side view of an exemplary GaN heterojunction field effect transistor (HFET) 200 in accordance with an embodiment of the inventive subject matter. In an embodiment, the GaN HFET device 200 may include a semiconductor substrate 110, an isolation region 120, an active region 125, a first dielectric layer 130, a source electrode 140, a drain electrode 145, a gate electrode 150, a first field plate 160, a second dielectric layer 170, and a second field plate 280. As is described in connection with the GaN HFET device 100 of FIG. 1, the GaN HFET device 200 may be substantially contained within the active region 125 defined by the isolation region 120, with the first dielectric layer 130, the source electrode 140, drain electrode 145, gate electrode 150, first field plate 160, second dielectric layer 170, and second field plate 280 disposed over the semiconductor substrate 110.

In an embodiment, the second field plate 280 may be disposed over the second dielectric layer 170 and first field plate 160. In an embodiment, the second field plate may be formed on the side of the gate electrode 150 facing the drain electrode 145. In an embodiment, the second field plate 280 may be coupled to the source electrode 140. The second field plate 280 may be disposed over the second dielectric layer 170, over the gate electrode 150 and first field plate 160, according to an embodiment. The second field plate 280 may wrap around the gate electrode 150 and first field plate 160 on the sides of the gate electrode 150 that face the source electrode 140 and the drain electrode 145, and extend to and contact the source electrode 140, according to an embodiment (not shown).

In an embodiment, the second field plate 280 may create a second metal-insulator-semiconductor region 287 and a third metal-insulator-semiconductor region 289 that includes the second field plate 280, the second dielectric layer 170, the first dielectric layer 130, and the semiconductor substrate 110. The second and third metal-insulator-semiconductor regions 287, 289 may act as portions of the active device and have a second and third threshold voltages, dependent on the thicknesses of the first dielectric layer 130 and the second dielectric layer 170, the amount of charge in channel 107, and interface charges that may exist between the dielectric layers themselves and between first dielectric layer 130 and the semiconductor substrate 110. In an embodiment, the second and third threshold voltages may be between −20 volts and −80 V. In other embodiments, the second and third threshold voltages may be between −10 volts and −200 volts. In an embodiment, the second field plate 280 may reduce the electric field and coupling and associated gate-drain capacitance between the gate electrode 150 and the drain electrode 145. In an embodiment, a second field plate drain extension 282 may extend from the portion of the second field plate 280 adjacent the first field plate 160 facing the drain electrode 145 toward the drain electrode 145 by a second field plate drain extension length 284. In other embodiments, the lower surface 283 of the second field plate drain extension 282 may contact with the first dielectric layer 130 of the gate electrode 150 (not shown). In still other embodiments, the lower surface 283 of the second field plate drain extension 282 may be above the second protruding region 156 of the gate electrode 150 where the second protruding region 156 contacts the first dielectric layer 130. In an embodiment, the second field plate drain extension length 284 characterizes the overlap of the second field plate 280 over the second dielectric layer 170 and the first dielectric layer 130. In an embodiment, the second field plate drain extension length 284 may be between about 0.2 microns and 2 microns. In other embodiments, the second field plate drain extension length 284 may be between about 0.1 and about 10 microns. Without departing from the scope of the inventive subject matter, the second field plate drain extension length 284 may have other longer or shorter lengths. In an embodiment, the second field plate 280 may be coupled to the same potential as the source electrode 140 or to a ground potential. In other embodiments, the second field plate 280 may be coupled to the gate electrode 150 (not shown). In other, further embodiments, the second field plate 280 may be coupled to an arbitrary potential (not shown). In an embodiment, source and drain metallization 285, 286 to the source and drain electrodes may be formed using the same conductive layer(s) as the second field plate 280.

In an embodiment, a field plate opening 272 may be created in the second dielectric layer 170 over the first field plate 160. The field plate opening 272 may allow the second field plate 280 to contact the first field plate at one or more connection point(s) 281, according to an embodiment. In some embodiments, the field plate opening 272 and connection points 281 may be continuous along the entire gate width of GaN HFET device 200. In other embodiments, the field plate opening 272 may be formed in distinct regions along the unit gate width (not shown). In these embodiments, a constant connection-to-connection distance between connection points 281 along the gate finger may be a fixed value of between about 5 microns and about 500 microns, though other shorter or longer values for the connection-to-connection distance may be used. In some embodiments, conductive straps 288 that electrically connect the second field plate 280 to the source electrode 140 may be formed periodically along the device finger using the same conductive layer used to form the second field plate 280. In an embodiment, these conductive straps 288 may be between 0.1 and 5 microns wide and may be placed at a strap-to-strap spacing along the device finger. In an embodiment, the strap-to-strap spacing may be between about 25 microns and about 100 microns, according to an embodiment, though other shorter or longer strap-to-strap spacings may be used. The strap-to-strap spacing may be between about 5 microns and about 200 microns, according to an embodiment, though other shorter or longer strap-to-strap spacings may be used. In other embodiments, connections of the second field plate 280 to the source electrode 140 may be accomplished either by connections from the second field plate 280 to the source electrode 140 using the same metal used to form second field plate 280 or by using another metal layer (e.g., an interconnect layer) at the end of the device finger in the isolation region 120 (not shown). In still other embodiments, connections between the source electrode 140 and the second field plate 280 may be accomplished by forming the second field plate 280 as a solid, continuous connection to the source electrode 140 (not shown).

Figure 3:
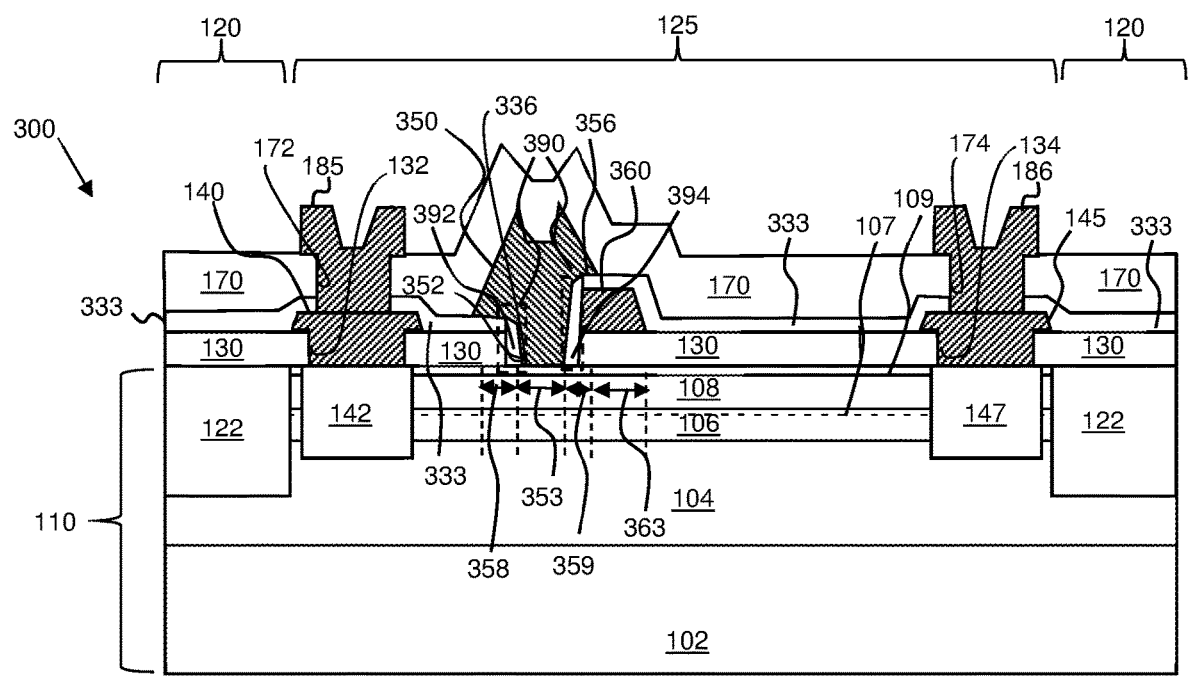
FIG. 3 is a cross-sectional, side view of an exemplary GaN heterojunction field effect transistor (HFET) in accordance with an embodiment.

FIG. 3 is a cross-sectional, side view of an exemplary GaN HFET device 300 in accordance with an embodiment. In an embodiment, the GaN HFET device 300 may include a semiconductor substrate 110, an isolation region 120, an active region 125, a first dielectric layer 130, a source electrode 140, a drain electrode 145, an intermediate dielectric layer 333, a gate electrode 350, a first field plate 360, a spacer layer 390, and a second dielectric layer 170.

In an embodiment, the first field plate 360 may be formed over the first dielectric layer 130. In an embodiment, the first field plate 360 may be formed using the same conductive layer used to form source and drain electrodes 140, 145. The first field plate length 363 and other dimensions, characteristics, and attributes of the first field plate 360 may be analogous to those described in connection with the first field plate 160 of FIG. 1.

According to an embodiment, the intermediate dielectric layer 333 may be formed over the first dielectric layer 130 and the first field plate 360. The thickness of the intermediate dielectric layer 333 may define the vertical distance between the second protruding region 356 of the gate electrode 350 and the first field plate 360. In an embodiment, the intermediate dielectric layer 333 may be formed using one or more of SiN, $SiO_2$, $Al_2O_3$, SiON, $HfO_2$, SiO, AlN, or other suitable substantially insulating material. The intermediate dielectric layer 333 may be configured as an etch stop, selective to etchants used to etch the spacer layer 390, according to an embodiment. In an example embodiment, the intermediate dielectric layer 333 may include a layer of $Al_2O_3$ or AlN that is selective to fluorine-based etching that may be used to etch the spacer layer 390 that may be formed using SiN or $SiO_2$, as described below. In an embodiment, the intermediate dielectric layer 333 may have a thickness between about 100 angstroms and about 500 angstroms. In other embodiments, the intermediate dielectric layer 333 may have a thickness between about 50 angstroms and about 4000 angstroms, though other thicker or thinner thickness values may be used.

According to an embodiment, the spacer layer 390 may formed within the gate opening 336 include a first portion 392 formed laterally adjacent the vertical stem 352 of the gate electrode 350 nearer the source electrode 140 ("first vertical face") and a second portion 394 formed laterally adjacent the vertical stem 352 of the gate electrode 350, nearer the drain electrode 145 ("second vertical face"). The first portion 392 and the second portion 394 may be formed within a gate opening 136 formed in the first dielectric layer 130, according to an embodiment. In an embodiment, the gate electrode 350 may be formed adjacent to and in contact with the first portion 392 and second portion 394 of the spacer layer 390. In an embodiment, the first field plate 360 may be formed below a second protruding region 356 of the gate electrode 350. In an embodiment, the spacer layer 390 may be formed adjacent the gate electrode 350, between the gate electrode 350 and a gate opening 336, adjacent to the second portion 394 of the spacer layer. The thickness of the spacer layer 390 may define the lateral distance between the gate electrode 350 and the first field plate 360. In an embodiment, the spacer layer 390 may be formed using one or more of SiN, $SiO_2$, $Al_2O_3$, SiON, $HfO_2$, SiO, AlN, or other suitable substantially insulating material. In an embodiment, the spacer layer 390 may have a thickness between about 200 angstroms and about 1000 angstroms. In other embodiments, the spacer layer 390 may have a thickness between about 50 angstroms and about 5000 angstroms, though other thicker or thinner thickness values may be used.

In an embodiment, the gate electrode 350 may be formed within the gate opening 336 and within the spacer 390. The gate length 353 and other dimensions, characteristics, and attributes of the gate electrode 350 (e.g., first protruding region length 358 and second protruding region length 359) may be analogous to those described in connection with the gate electrode 350 of FIG. 1.

Figure 4:
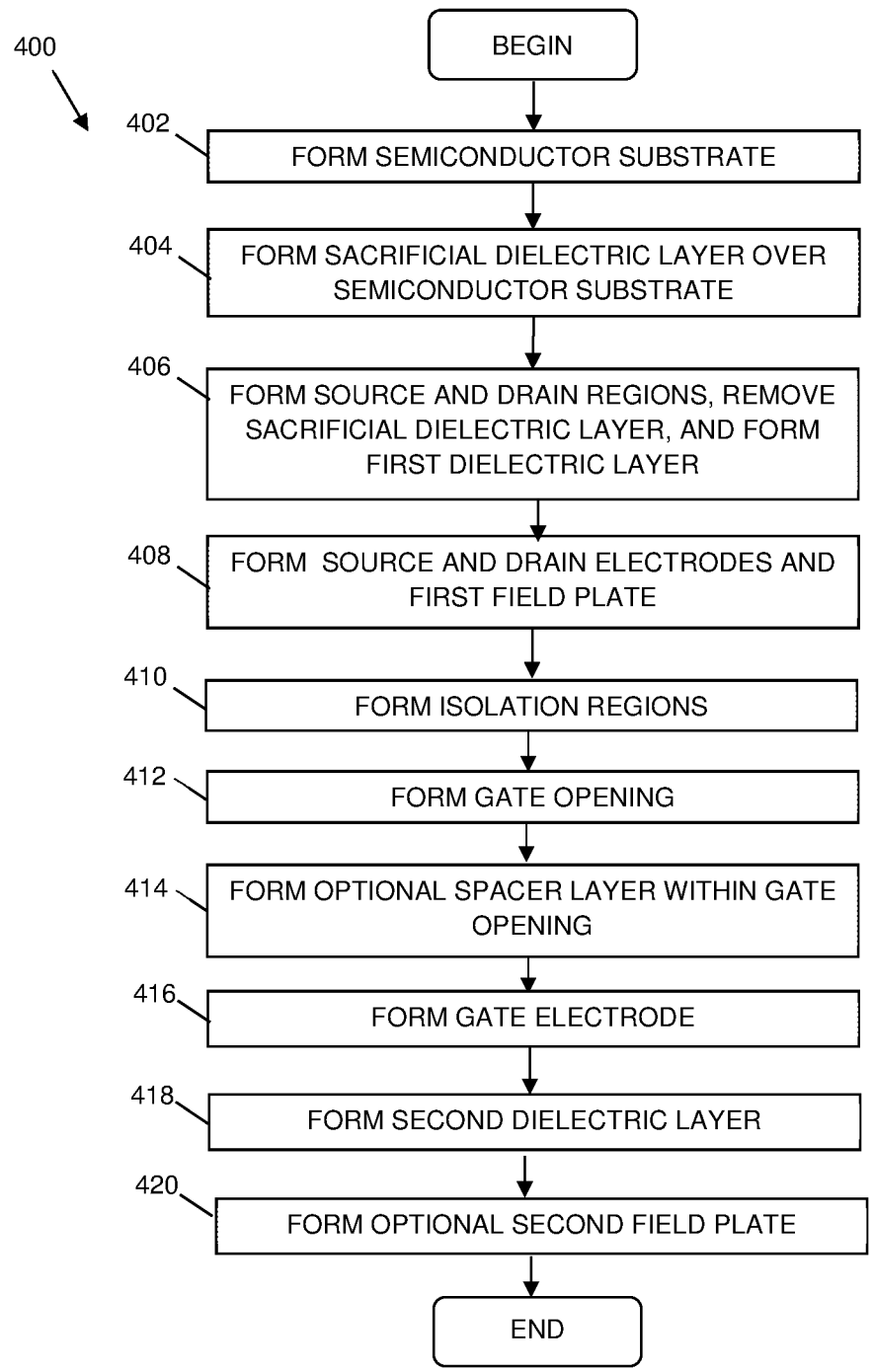
FIG. 4 is a process flow diagram describing a method for fabricating the GaN heterojunction field effect transistor (HFET) devices of FIGS. 1-3 in accordance with an embodiment.

The flowchart 400 of FIG. 4 describes embodiments of methods for fabricating semiconductor devices (e.g., GaN HFET devices 100, 200 FIGS. 1-2). FIG. 3 should be viewed alongside FIGS. 5, 6, 7A, 7B, 7C, 7D, 8A, 8B, 9, 10A, 10B, 11A, 11B, 11C, 11D, 11E, 11F, 12A, 12B, and 12C which illustrate cross-sectional, side views of a series of fabrication steps for producing the semiconductor devices of FIGS. 1-3, in accordance with an example embodiment.

Figure 5:
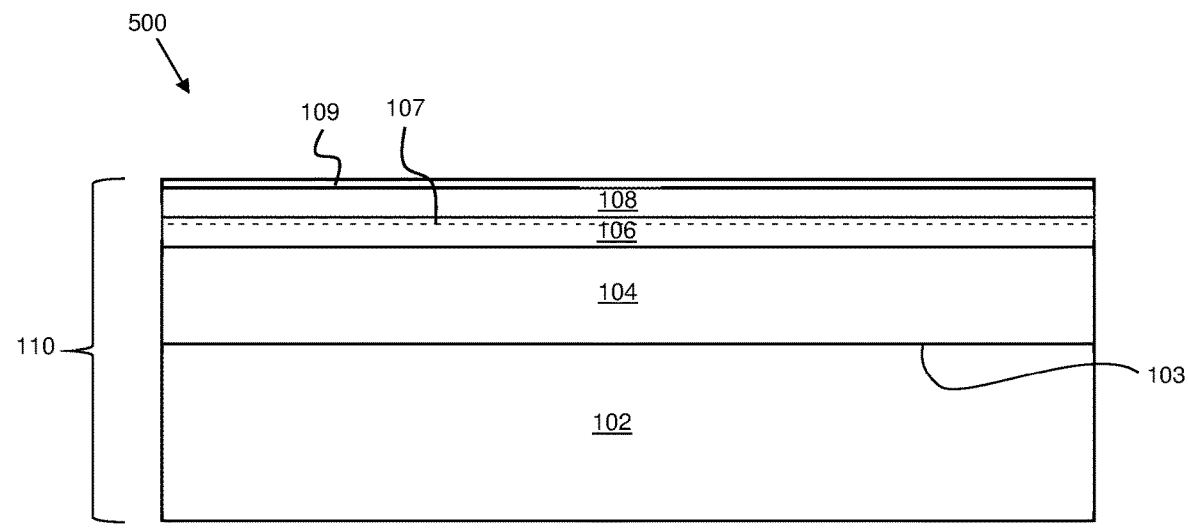
FIG. 5 is a cross-sectional, side view of a fabrication step for producing a GaN HFET device, in accordance with embodiments of the method of fabrication.

In block 402 of FIG. 4, and as depicted in the step 500 of FIG. 5, an embodiment of the method may include forming a semiconductor substrate 110. In an embodiment, the step 500 may include providing a host substrate 102 and forming number of semiconductor layers on or over the host substrate 102. In an embodiment, the host substrate 102 may include SiC, or may include other materials such as sapphire, Si, GaN, AlN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming the channel layer 106 on or over the buffer layer 104, forming the barrier layer 108 on or over the channel layer 106, and forming the cap layer 109 on or over the barrier layer 108. As discussed previously, embodiments of the buffer layer 104, the channel layer 106, the barrier layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE) or a combination of these techniques, although other suitable techniques may alternatively be used. Semiconductor substrate 110 results.

Figure 6:
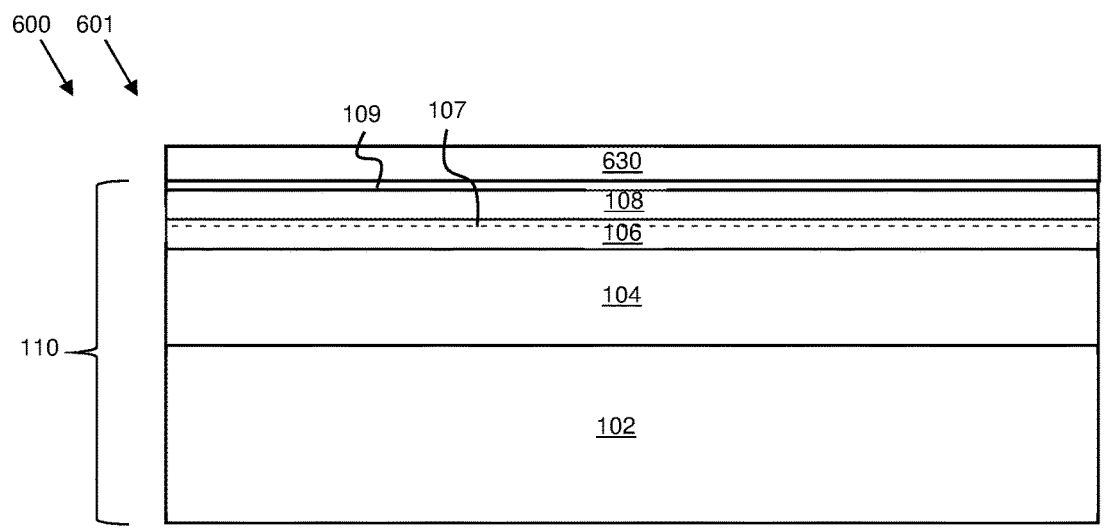
FIG. 6 is a cross-sectional, side view of a fabrication step for producing a GaN HFET device, in accordance with embodiments of the method of fabrication.

In block 404 of FIG. 4, and as depicted in a step 600 of FIG. 6, an embodiment of the method may include forming a sacrificial dielectric layer 630 on or over the semiconductor substrate 110. As discussed previously, in an embodiment, the sacrificial dielectric layer 630 may include materials selected from SiN, $Al_2O_3$, $SiO_2$, AN, and $HfO_2$. The sacrificial dielectric layer 630 may be formed using one or more of low pressure chemical vapor deposition (LPCVD), atomic layer deposition (ALD), sputtering, physical vapor deposition (PVD), plasma-enhance chemical vapor deposition (PECVD), MOCVD, MBE, inductively coupled plasma (ICP) deposition, electron-cyclotron resonance (ECR) deposition, or other suitable techniques. In other embodiments, the sacrificial dielectric layer 630 may be formed, in-situ, immediately after and in the same chamber or deposition system (e.g., MOCVD or MBE) as the growth of the semiconductor layers of semiconductor substrate 110. Structure 601 results.

In block 406 of FIG. 4, and as depicted in steps 700, 702, 704, and 706 of FIGS. 7A, 7B, 7C, and 7D, an embodiment of the method may include forming source and drain regions 142 and 147 below the sacrificial dielectric layer 630, removing the sacrificial dielectric layer 630, and forming the first dielectric layer 130. Referring again to FIG. 7A and step 700, an embodiment of the method may include patterning an implant mask 710 and implanting a dopant species 720 through an opening 715 in implant mask 710 into the semiconductor substrate to form the implant regions 730 within the semiconductor substrate 110. Once the implant mask 710 is patterned, a dopant species may be implanted through the sacrificial dielectric layer 630 and into the semiconductor substrate 110. In an embodiment, Si, Ge, 0, or other suitable n-type dopant may be implanted into the semiconductor substrate through the implant mask. Structure 701 results.

Figure 7A:
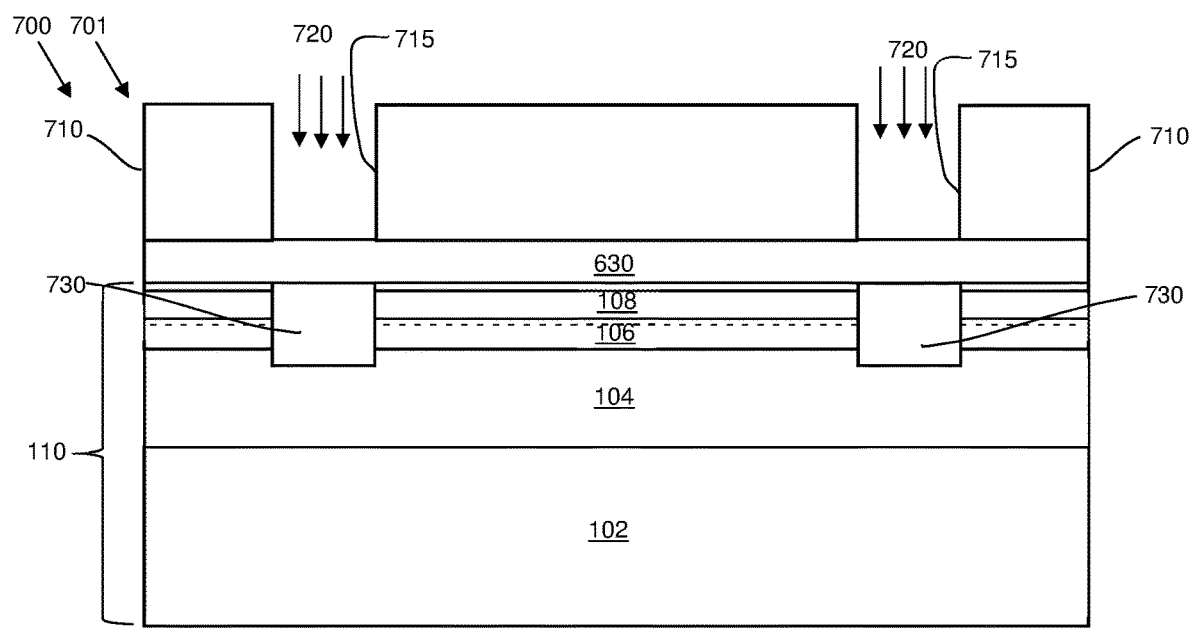
FIGS. 7A, 7B, 7C, and 7D are cross-sectional, side views of fabrication steps for producing a GaN HFET device, in accordance with embodiments of the method of fabrication.
Figure 7B:
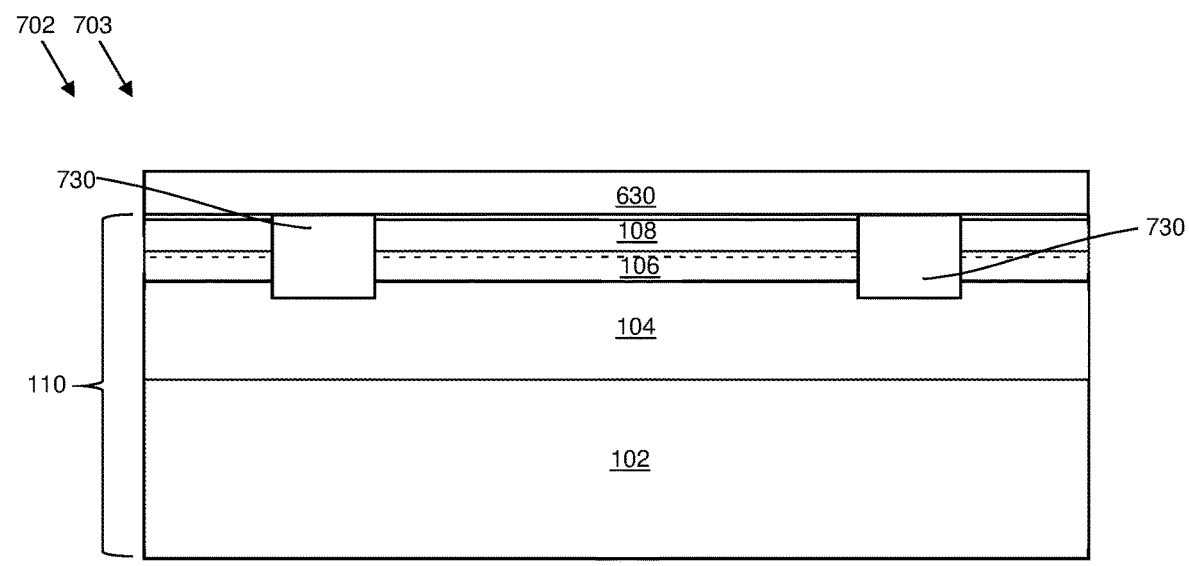

Referring again to block 406 of FIG. 4, now to FIG. 7B and step 702, an embodiment of the method may include removing the implant mask 710. and activating the dopant species to complete the formation of the source and drain regions 142 and 147 within the semiconductor substrate 110.

The implant mask 710 may be removed using one or more conventional wet chemical and plasma ashing technique(s). Structure 703 results.

Figure 7C:
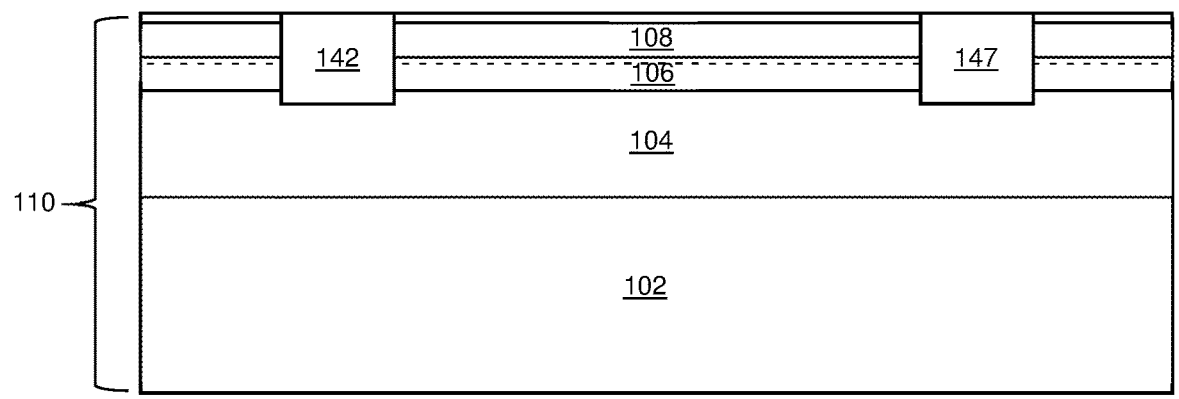

Referring again to block 406 of FIG. 4, and now to FIG. 7C and step 704, an embodiment of the method may include activating the implant regions 730 of structure 703 of FIG. 7B. According to an embodiment, the dopant species may be activated by annealing the semiconductor substrate 110 using an activation anneal at a temperature of between about 900° C. and about 1500° C. In some embodiments, the duration of the activation anneal may be between about 60 seconds and about 600 seconds. In other embodiments, the duration of the activation anneal may be between about 10 seconds and about 2000 seconds. Structure 705 results.

Figure 7D:
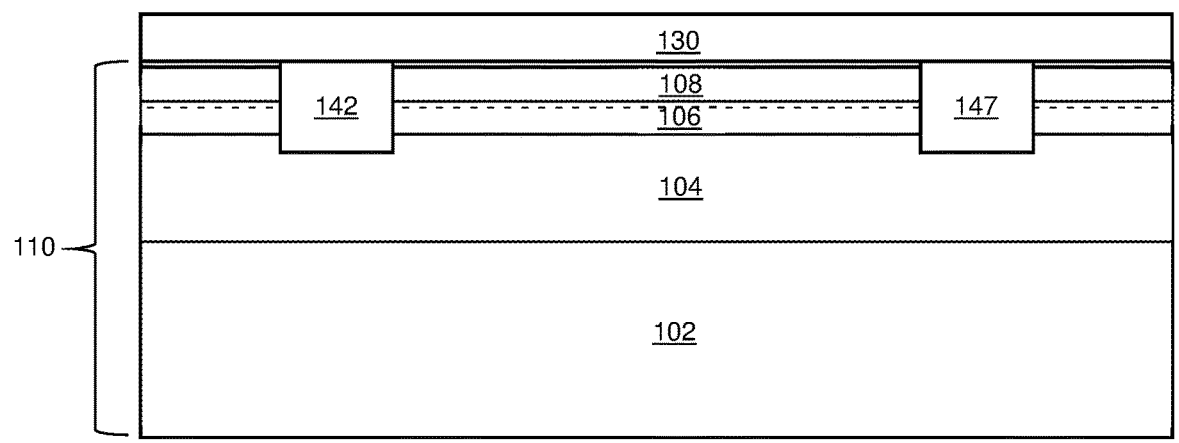

Referring again to block 406 of FIG. 4, now to FIG. 7D and step 706, an embodiment of the method may include forming the first dielectric layer 130 on or over the semiconductor substrate 110 of the structure 705 of FIG. 7C. As discussed previously, in an embodiment, the first dielectric layer 130 may include materials selected from SiN, $Al_2O_3$, $SiO_2$, AlN, and $HfO_2$. The first dielectric layer 130 may be formed using one or more of low pressure chemical vapor deposition (LPCVD), atomic layer deposition (ALD), sputtering, physical vapor deposition (PVD), plasma-enhance chemical vapor deposition (PECVD), MOCVD, MBE, inductively coupled plasma (ICP) deposition, electron-cyclotron resonance (ECR) deposition, or other suitable techniques. Structure 707 results.

Figure 8A:
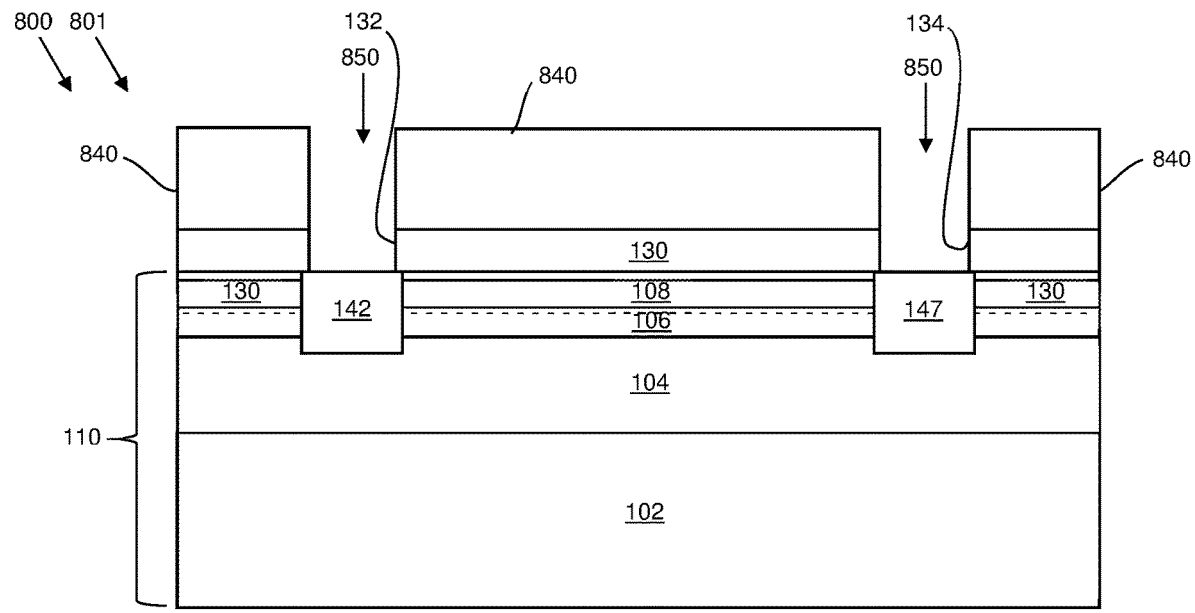
FIGS. 8A, 8B, and 8C are cross-sectional, side views of fabrication steps for producing a GaN HFET device, in accordance with embodiments of the method of fabrication.
Figure 8B:
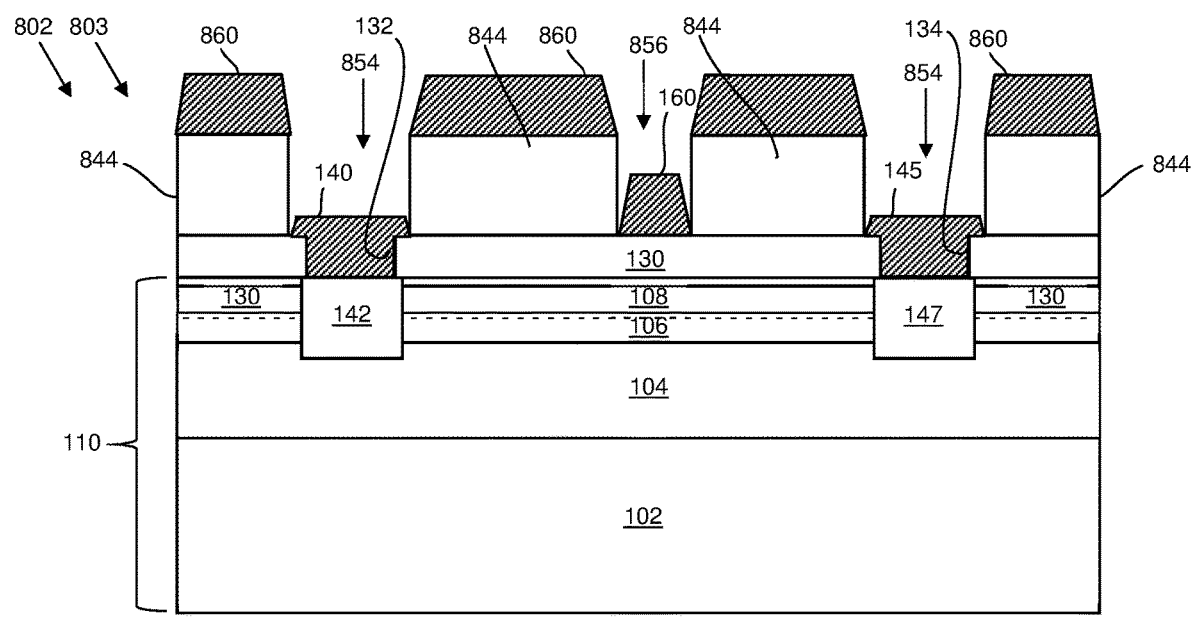
Figure 8C:
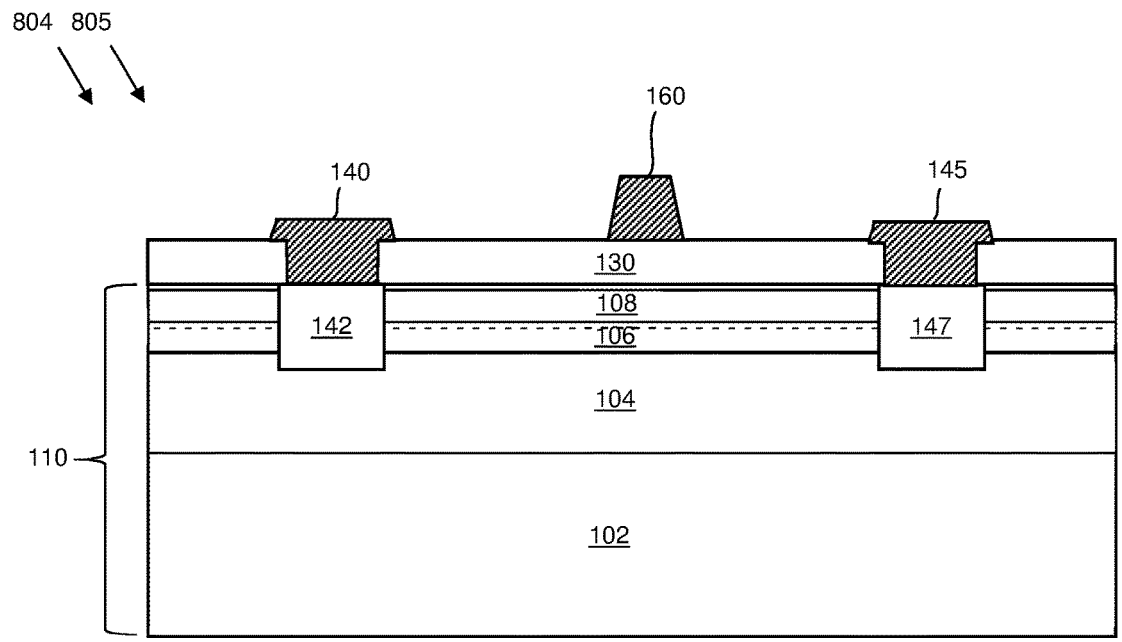

In block 406 of FIG. 4, and as depicted in steps 800, 802, and 804 of FIGS. 8A, 8B, and 8C, an embodiment of the method may include forming source and drain electrodes 140 and 145 and first field plate 160. In an embodiment, and referring to FIG. 8A, forming the source and drain openings 132, 134 and may include dispensing a resist layer 840 over the first dielectric layer 130 and patterning the resist layer 840 to form resist openings 850. In an embodiment, source and drain electrodes 140 and 145 may be created by etching through the first dielectric layer 130 in areas exposed by the resist openings 850 to form source and drain openings 132 and 134. Etching the first dielectric layer 130 (e.g., SiN) may include etching using one or more dry and/or wet etch technique(s) such as reactive ion etching (ME), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the first dielectric 130 may selectively etch a portion of the first dielectric layer 130 and then stop on an etch stop layer (not shown) (e.g., $Al_2O_3$ or AlN). In an embodiment, etching the etch stop layer (e.g., an $Al_2O_3$ or AlN etch stop layer) may include wet and/or dry etch techniques. In other embodiment(s), dry etching of the etch stop layer (e.g., an AlN or $Al_2O_3$ etch stop) may include dry etching using suitable techniques (e.g., ME, ICP, or ECR) in conjunction chlorine-based chemistry such as $Cl_2$, boron trichloride ($BCl_3$), or other suitable dry-etch chemistries. Structure 801 results.

Referring now to block 408 of FIG. 4, and step 802 of FIG. 8B, an embodiment of the method may include forming and patterning the source and drain electrodes 140 and 145 in the source and drain openings 132 and 134 and the first field plate 160 over the first dielectric layer 130. In an embodiment, the method may include dispensing a resist layer 844 over structure 801 of FIG. 8A, patterning openings 854, 856 in the resist layer 844, and depositing the first conductive layer 860 over the resist layer 844 and into the source and drain openings 132 and 134 and field plate opening 856. In an embodiment, the first conductive layer 860 may contain one or more conductive layers that include Ti, Ta, Al, Mo, Au, Ni, Si, Ge, platinum (Pt), tungsten (W), and or other refractory metals, that when annealed, may form an ohmic contact with the source and drain regions 142, 147. In an embodiment, the first conductive layer 860 may include a stack deposited on the substrate that includes Ti, Al, and Au. In an embodiment, to form the first conductive layer 860, a Ti layer may be disposed over the semiconductor substrate 110 in the openings 854, 856, an Al layer may be disposed over the Ti layer, a barrier layer formed from Mo or other suitable barrier metal such as Ni or tungsten, may be disposed over the Al layer, and an Au layer may be disposed over the barrier layer. In an embodiment, the first conductive layer 860 may be deposited by evaporation. In other embodiments, the first conductive layer 860 may be deposited by sputtering, PVD, or other suitable deposition techniques. In an embodiment, the Ti layer may be between about 100 angstroms and 200 angstroms thick, the Al layer may be between about 600 angstroms and 1500 angstroms thick, the Mo layer may be between about 200 angstroms and 700 angstroms thick, and the Au layer may be between about 300 angstroms and 1000 angstroms thick. In other embodiments, other metals may be substituted (e.g., Ni or Pt may be substituted for Mo or Ta may be used in addition to Ti, above or below Ti, to or substituted for Ti) and other thicknesses may be used. In an embodiment, the resist layer 844 may be configured in a lift-off profile, wherein the openings of the resist layer 844 have a retrograde profile, allowing the metal not deposited into resist openings 850 to "lift off" when dissolved in solvents. In other embodiments, the source and drain electrodes 140 and 145 may be patterned by dry etching (not shown). Structure 803 results.

Referring again to block 408 of FIG. 4, and as depicted in step 804 of FIG. 8C, an embodiment of the method may include annealing source and drain electrodes 140 and 145 and the first field plate 160. In an embodiment, annealing the source and drain electrodes 140 and 145 and first field plate 160 may include an annealing step used to alloy the first conductive layer 860 of FIG. 8B, resulting in ohmic contacts to the source and drain regions 142 and 147 formed in semiconductor substrate 110 that form source and drain electrodes 140 and 145. In an embodiment, the annealing step may be accomplished by rapid thermal annealing. In an embodiment, the first conductive layer 860 of FIG. 8B that remains in source and drain openings 132 and 134 of FIG. 6C may be alloyed at a temperature of between about 400 degrees Celsius and about 700 degrees Celsius for between about 15 seconds and about 60 seconds. In other embodiments the first conductive layer 860 of FIG. 8B may be annealed at between about 300 degrees Celsius and about 800 degrees Celsius for between about 10 seconds and about 600 seconds, though other higher or lower temperatures and times may be used. In an embodiment, the metal stack used to form the first conductive layer 860 (e.g., Ti, Al, Mo, and Au) may form the source and drain electrodes 140 and 145 and first field plate 160, 360. Structure 805 results.

Without departing from the scope of the inventive subject matter, drain and source electrodes 140 and 145 and first field plate 160 may be formed using alloyed ohmic contacts (not shown). In these embodiments, source and drain regions may not be formed. Rather, ohmic contact to semiconductor substrate 110 is accomplished by high temperature annealing of the ohmic metals (e.g., Ti, Al, Mo, Au may be used to form an ohmic contact to the channel 107, as described above).

Figure 9:
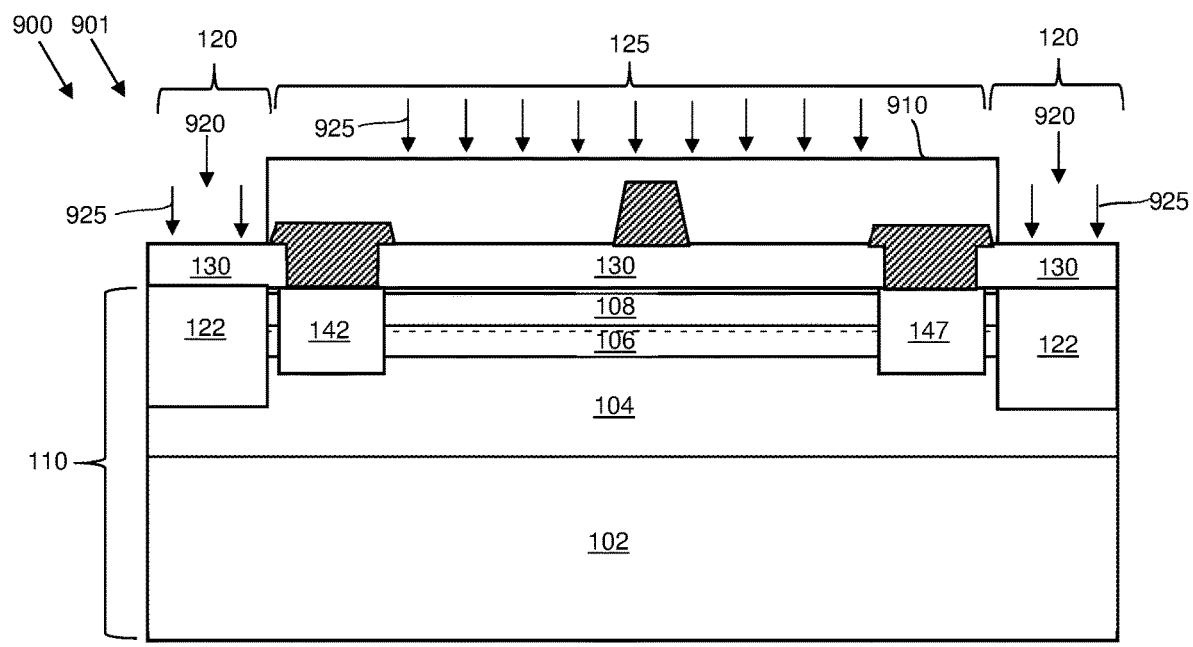
FIG. 9 is a cross-sectional, side view of a fabrication step for producing a GaN HFET device, in accordance with embodiments of the method of fabrication.

Referring now to block 410 and step 900 of FIG. 9, in an embodiment, the method may include creating isolation regions 120. Forming the isolation regions 120 may include dispensing and patterning a resist mask 910 over the first dielectric layer 130 and then defining openings 920 in the resist mask 910. Using ion implantation, a dopant species 925 (e.g., one or more of oxygen, nitrogen, boron, arsenic, and helium) may be driven into the semiconductor substrate 110 to create high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122 of the isolation regions 120. In other embodiments (not shown), forming the isolation regions 120 may include, first, etching some or all of the semiconductor layers in the semiconductor substrate 110 and then ion implanting to enhance the resistivity in the remaining semiconductor layers and/or the host substrate 102. Structure 901 results.

Figure 10A:
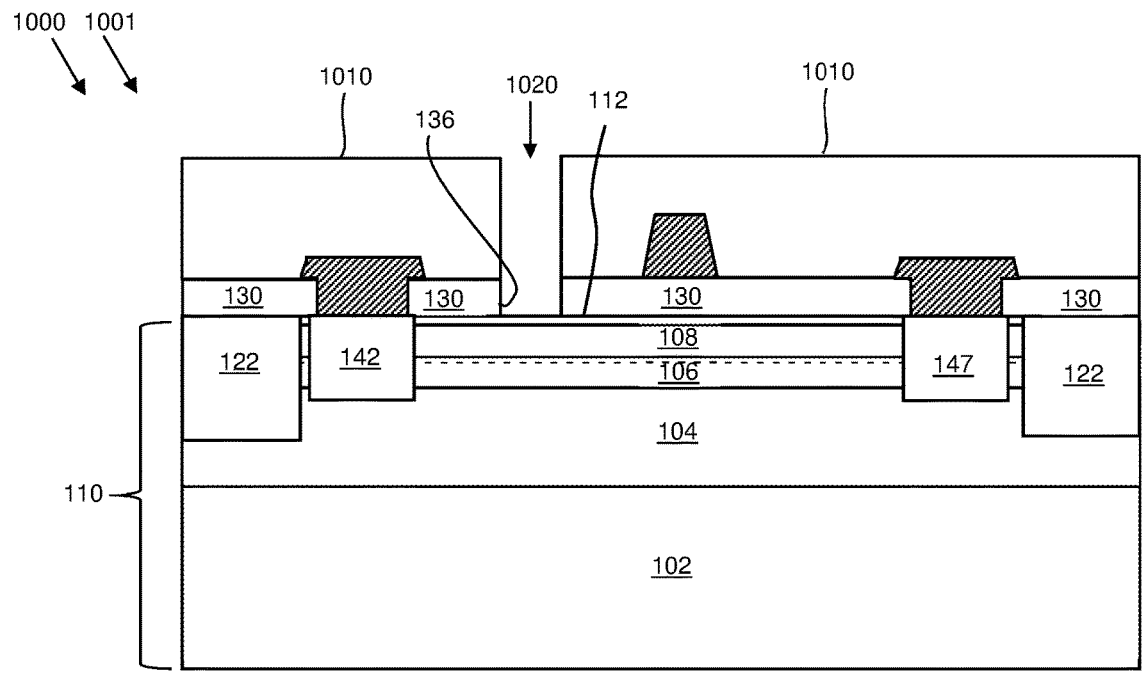
FIGS. 10A and 10B are cross-sectional, side views of fabrication steps for producing a GaN HFET device, in accordance with embodiments of the method of fabrication.
Figure 10B:
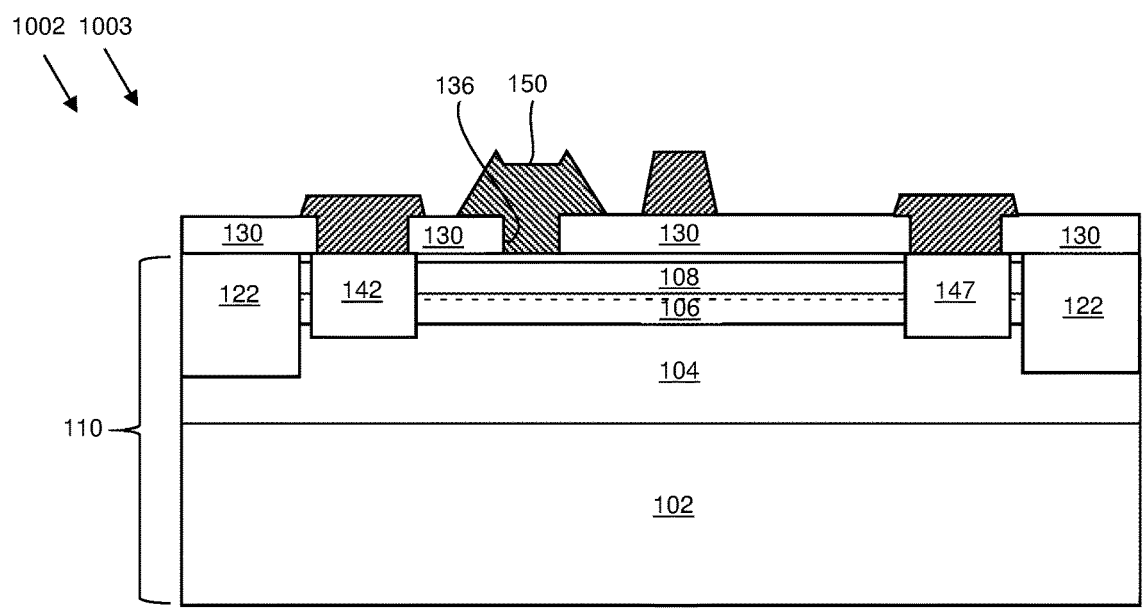

Referring next to blocks 412 and 416 of FIG. 4 and steps 1000, 1002 of FIGS. 10A and 10B, in an embodiment, forming the gate electrode 150 of the GaN HFET devices 100, 200 of FIGS. 1 and 2 may include forming the gate opening 136 in the first dielectric layer 130 and forming the gate electrode 150 within the gate opening 136. In an embodiment, forming the gate electrode 150 may include depositing and patterning a conductive material (i.e., "second conductive material") to form the gate electrode 150.

Referring now to FIG. 10A and step 1000, in an embodiment of the method, a resist layer 1010 (e.g., photo resist or e-beam resist) may be patterned to create an opening 1020 in the resist layer 1010. Using the opening created in the resist layer 1010, the first dielectric layer 130 may be etched dry and/or wet chemical etch(s) analogous to that described in connection with FIG. 8A, step 800, to form the gate opening 136, thus exposing a portion of the upper substrate surface 112, according to an embodiment. Structure 1001 results. The resist layer 1010 may then be removed using wet stripping and/or plasma ashing, according to an embodiment (not shown).

Referring now to FIG. 10B and step 1002, in an embodiment, one or more layers of gate metal may then be deposited and patterned to form the gate electrode 150 over the upper substrate surface 112 of the semiconductor substrate 110 over the first dielectric layer 130 and within the gate opening 136, using, e.g., the lift-off resist technique, analogous to the description given for FIG. 8B and step 802. Depositing gate metal to form the gate electrode 150 may include depositing a multi-layer stack that includes one or more metal layers and/or other suitable materials. A first layer within the multi-stack used to form the gate electrode 150 may include Ti, Ni, Pt, Cu, palladium (Pd), Cr, W, Iridium (Ir), poly-silicon or other suitable materials. The first layer may be between about 30 and about 2,000 angstroms in thickness, although other thickness values may be used. One or more layers that act as conductive layers may be deposited over the first layer to form the gate electrode 150, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir or other substantially refractive materials that act as a barrier between the portion of the first layer that contacts the semiconductor substrate 110 and first dielectric layer 130 and the conductive layer(s). The barrier metal layer(s) may be between about 50 and about 10,000 angstroms in thickness, although other thickness values may be used. In an embodiment, the various layers used to form gate electrode 150 may be deposited by evaporation, sputtering, PVD, ALD, or other suitable deposition technique(s). Structure 1003 results.

It should be appreciated that other methods may be used to form the gate electrode 150 without departing from the scope of the inventive subject matter. In other embodiments, gate metal may be disposed over a gate dielectric such as SiO2, HfO2, Al2O3, or similar materials (not shown). The gate dielectric may be deposited over and above the upper substrate surface 112, according to an embodiment. In still other embodiments, the gate electrode 150 may be formed using gate metal that is deposited over the semiconductor substrate 110 and is then defined by patterning photo resist, and then etching the gate metal (not shown). In whichever embodiment or method is selected to form gate electrode 150, gate metal may then be deposited using the methods described in connection with the formation of gate electrode 150 shown in FIG. 10B.

Referring now to blocks 412, 414, and 416 of FIG. 4, now to FIGS. 11A, 11B, 11C, 11D, 11E, and 11F, and steps 1100, 1102, 1104, 1106, and 1108, an embodiment of the method for forming the GaN HFET device 300 of FIG. 3 may include forming the gate opening 336, the spacer layer 390, and the gate electrode 350. In an embodiment, forming the gate electrode 350 may include forming the spacer layer 390 within the gate opening 336 formed in the first dielectric layer. In an embodiment, a portion of the gate electrode 350 may be formed above the first field plate 160.

Figure 11A:
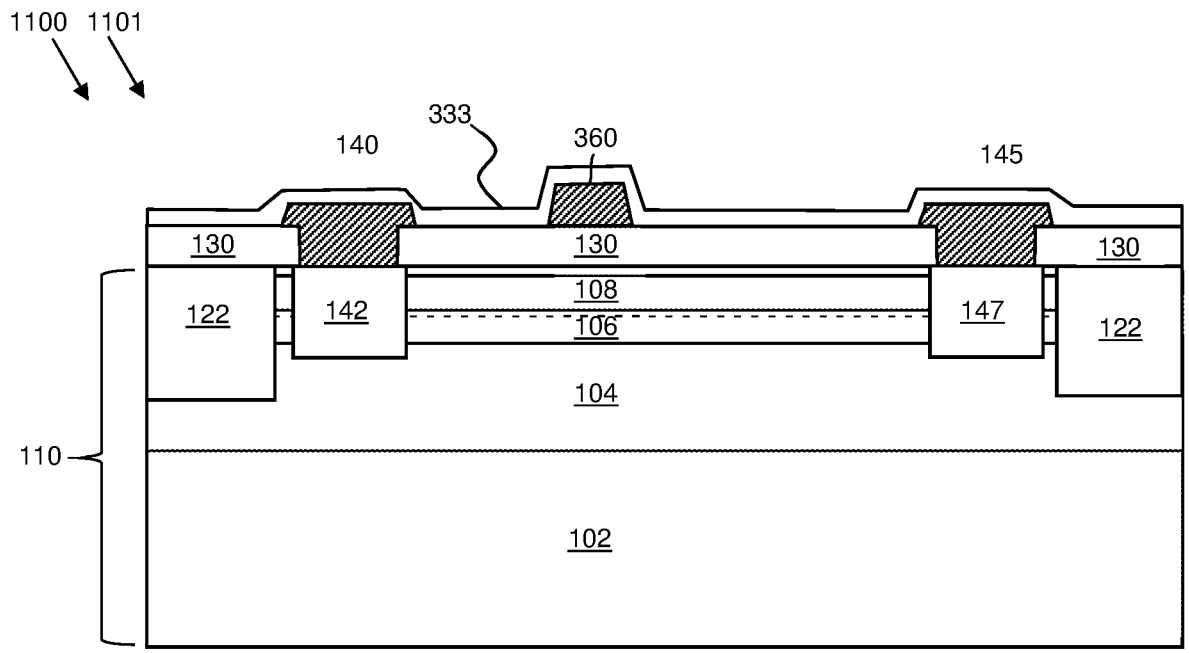
FIGS. 11A, 11B, 11C, 11D, 11E, and 11F are cross-sectional, side views of fabrication steps for producing a GaN HFET device, in accordance with embodiments of the method of fabrication.

Referring now to FIG. 11A and step 1100, according to an embodiment of the method, the intermediate dielectric layer 333 may be formed over the first dielectric layer 130, the source electrode 140, the drain electrode 145, and the first field plate 360. In an embodiment, the intermediate dielectric layer 333 may include one of SiN, $Al_2O_3$, $SiO_2$, $HfO_2$, ITO, diamond, poly-diamond, AlN, BN, SiC, or a combination of these or other insulating materials. The intermediate dielectric layer 333 may be configured to be an etch-stop layer, according to an embodiment. The total thickness of the layers used to form the intermediate dielectric layer 333 may be between about 50 and about 1000 angstroms in thickness, although other thickness values may be used. The intermediate dielectric layer 333 may be deposited using LPCVD, PECVD, sputtering, PVD, ALD, Cat-CVD, HWCVD, ECR CVD, CVD, ICP-CVD, a combination of these or other suitable dielectric deposition technique(s). Structure 1101 results.

Figure 11B:
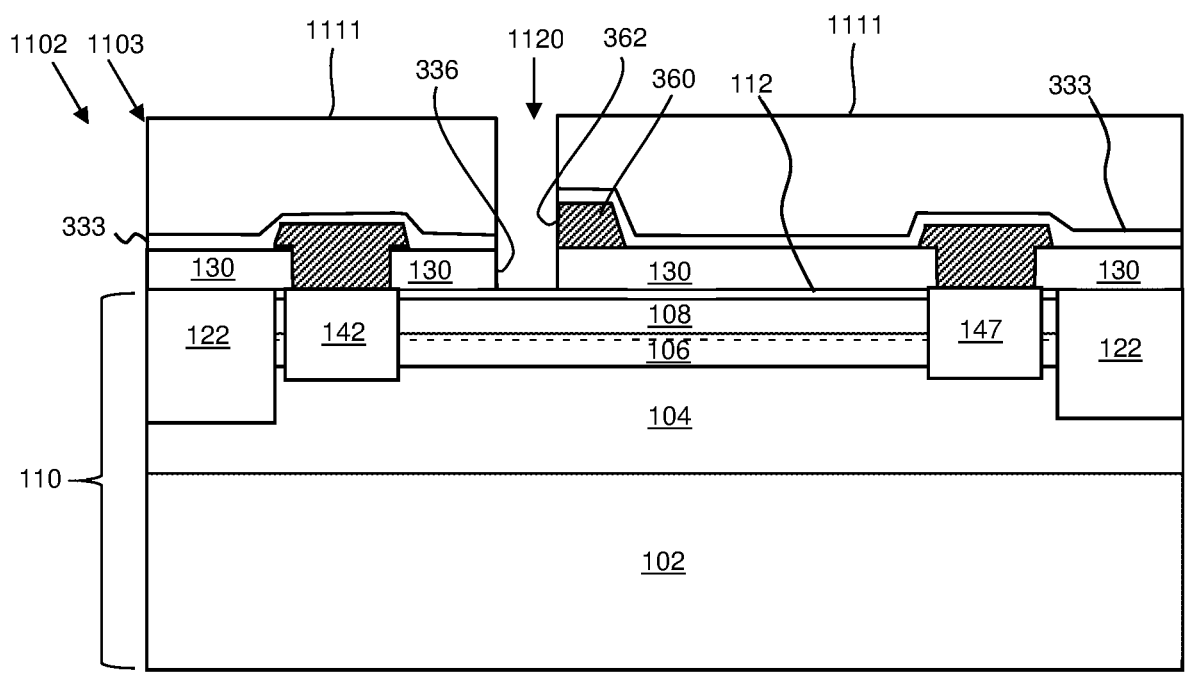

Referring now to FIG. 11B and step 1102, in an embodiment of the method, a resist layer 1111 (e.g., photo resist or e-beam resist) may be patterned to create an opening 1120 in the resist layer 1111. Using the opening created in the resist layer 1111, the intermediate dielectric layer 333, a portion of the first field plate 360, and the first dielectric layer 130 may be etched dry and/or wet chemical etch(s) analogous to that described in connection with FIG. 8A, step 800, to form the gate opening 336, thus exposing a portion of the upper substrate surface 112 and an etched face 362 of the first field plate 360, according to an embodiment. The resist layer 1111 may then be removed using wet stripping and/or plasma ashing, according to an embodiment (not shown). Structure 1103 results.

Figure 11C:
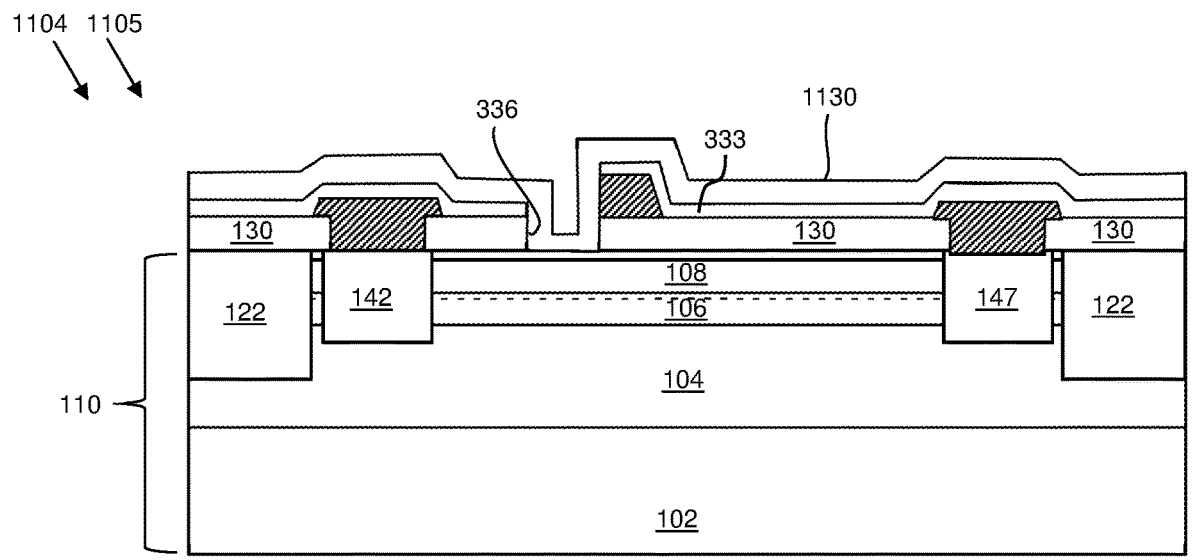
Figure 11D:
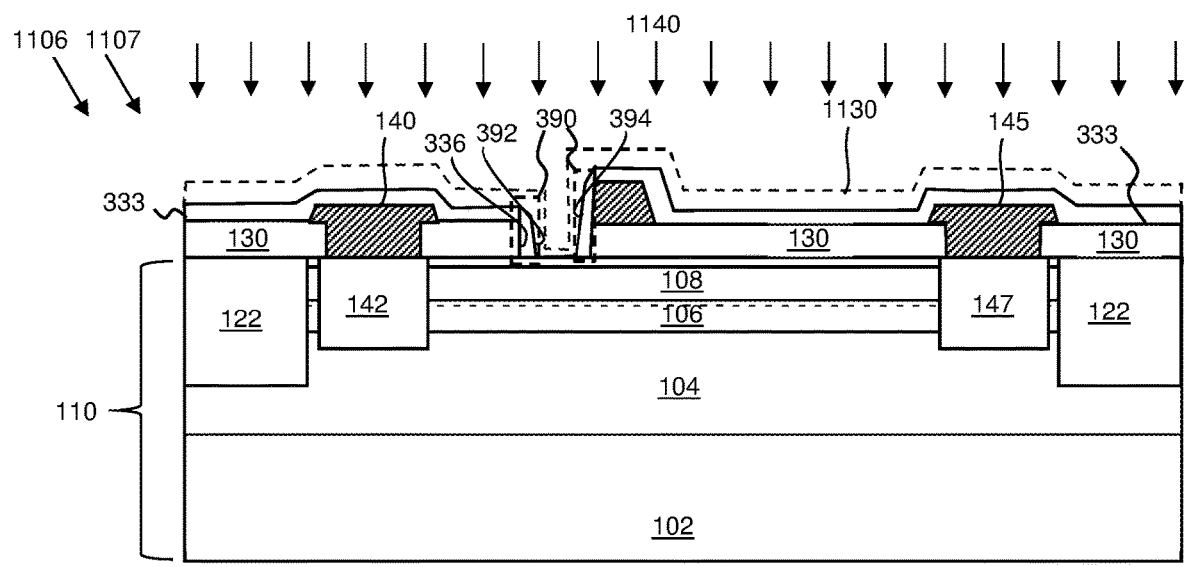
Figure 11E:
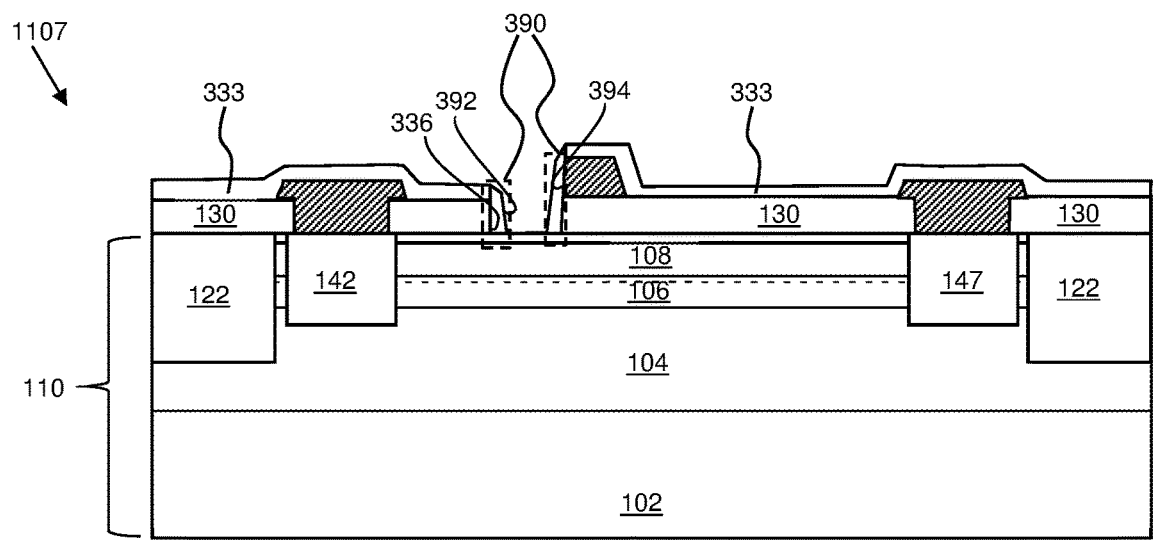

Referring now to FIGS. 11C, 11D, and 11E and steps 1104 and 1106, an embodiment of the method may include forming the spacer layer 390. In an embodiment, and as shown in FIG. 11C, forming the spacer layer 390 may include conformally depositing a blanket dielectric layer 1130 over the intermediate dielectric layer 333 and within the gate opening 336 in the first dielectric layer 130. Structure 1105 results. In an embodiment of the method, and as shown in FIG. 11D, depositing the blanket dielectric layer 1130 is followed by step 1106 of anisotropically etching the blanket dielectric layer 1130 of structure 1105. The anisotropic etching of the blanket dielectric layer 1130 may be accomplished by using a dry etch 1140 to form a first portion 392 of the spacer layer 390 that abuts the face of the gate opening 336 closer to the source electrode 140 and forming a second portion 394 that abuts the face of the gate opening 336 closer to the drain electrode 145. Structure 1107 results.

Figure 11F:
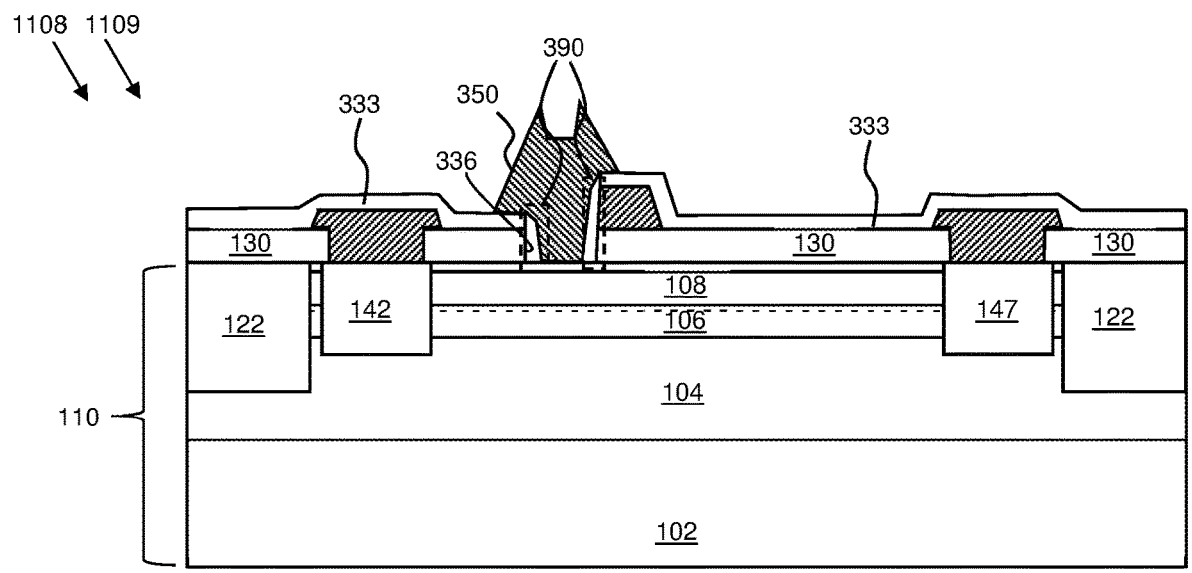

Referring now to FIG. 11F and step 1108, an embodiment of the method may include forming the gate electrode 350. The gate electrode 350 may be formed adjacent to the spacer layer 390 within the gate opening 336, according to an embodiment. In an embodiment, the gate electrode 350 may contact the spacer layer 390. The methods used to form the gate electrode 350 are analogous to those used to form gate electrode 150 as described in connection with FIG. 10B, step 1002 and are not repeated here for the sake of brevity. Structure 1109 results.

Figure 12A:
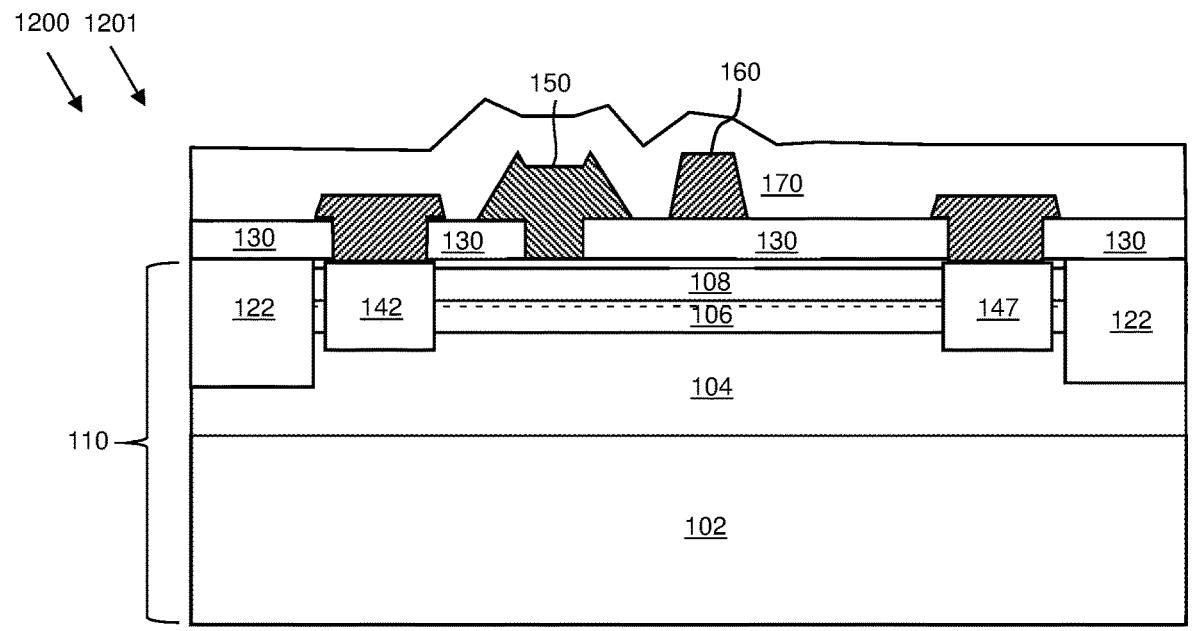
FIGS. 12A and 12B are cross-sectional, side views of fabrication steps for producing a GaN HFET device, in accordance with embodiments of the method of fabrication.
Figure 12B:
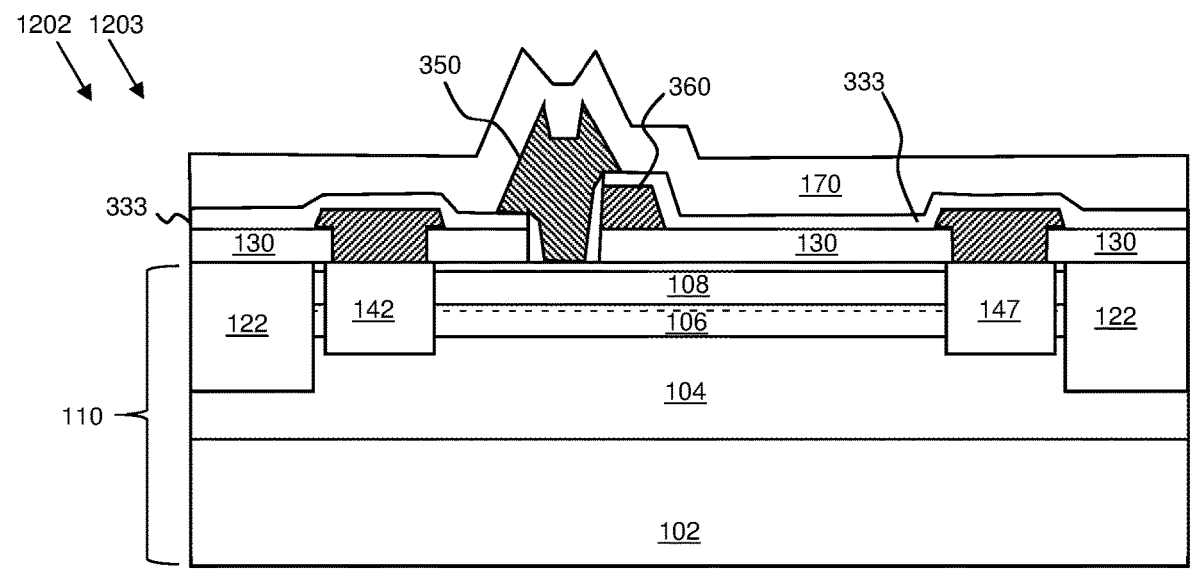

Referring now to blocks 418 of FIG. 4, FIGS. 12A and 12B and steps 1200, 1202, the method of fabricating the GaN HFET devices 100, 200, 300 of FIGS. 1-3 may further include depositing and patterning the second dielectric layer 170 over the source and drain electrodes 140,145, the gate electrode 150, 350, the first field plate 160, 360, and the first dielectric layer 130 of structures 1003 and 1109 of FIGS. 10B and 11F, according to an embodiment. In an embodiment, the second dielectric layer 170 may include one of SiN, Al2O3, SiO2, HfO2, ITO, diamond, poly-diamond, AlN, BN, SiC, or a combination of these or other insulating materials. The total thickness of the layers used to form the second dielectric layer 170 may be between about 100 and about 10,000 angstroms in thickness, although other thickness values may be used. The second dielectric layer 170 may be deposited using LPCVD, PECVD, sputtering, PVD, ALD, Cat-CVD, HWCVD, ECR CVD, CVD, ICP-CVD, a combination of these or other suitable dielectric deposition technique(s).

Referring now to block 420 of FIG. 4, FIGS. 13A, 13B, and 13C, and steps 1300, 1302, and 1304, the method of fabricating the GaN HFET devices 100, 200, and 300 of FIGS. 1, 2, and 3 may further include creating openings 172, 174, and, optionally, opening 278 (for GaN HFET device 200 of FIG. 2) in the second dielectric layer 170, according to an embodiment. This is followed depositing and patterning the second field plate 280 and source and drain metallization 185, 186 over the second dielectric layer 170, within the openings 172, 174, 278 and over source and drain electrodes 140, 145, according to an embodiment.

In an embodiment, the steps to etch the second dielectric layer 170 may be analogous to those used to etch the first dielectric layer 130 as described in connection with FIG. 8A, step 800, and may be used to create openings 172, 174, and 278. In an embodiment, the second dielectric layer 170 may be patterned by placing a resist layer (not shown) over second dielectric layer 170, and patterning the resist layer to form openings to portions of the second dielectric layer 170 over source and drain electrodes 140, 145. The second dielectric layer 170 may then be etched through the openings in the resist layer using a technique analogous to the etching of first dielectric layer 130, as described in connection with FIG. 8A, step 800. Accordingly, openings 172 and 174 may be created in structure 1201 of FIG. 12A and openings 172, 174, and 278 are formed in structure 1203 of FIG. 12B (etching not shown).

In an embodiment, forming and patterning the second field plate 180, 280 and source and drain metallization 185, 186 may be accomplished by applying and patterning resist layers (not shown), depositing the second field plate 180, source and drain metallization 185, 186 and removing the resist layers and overlying metal outside the second field plate 180, 280, source and drain metallization 185, 186, and other structures (e.g. interconnects, not shown) in a lift-off configuration, analogous to step 802 in FIG. 8B. In an embodiment, the second field plate metal is formed by depositing one or more adhesion and conductive metal layers into openings (not shown) patterned into resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers used to form the second field plate metal 280 may be deposited over and in contact with the second dielectric layer 170 and the first field plate 160, according to an embodiment. In an embodiment, the adhesion layer(s) and conductive layer(s) may be formed by sputtering, evaporation, or electro-plating. In an embodiment, after applying and patterning resist layers and depositing the second field plate 180, 280, the resist layers and metals deposited over the resist layers and not included with the portions of the second field plate metal that contact the second dielectric layer 170, first field plate 160 are removed using solvents analogous to those described in conjunction with step 802 in FIG. 8B. In other embodiments, the second field plate metal may be formed by depositing adhesion and conductive layers that are then patterned by suitable dry or wet chemical etching techniques.

Figure 13A:
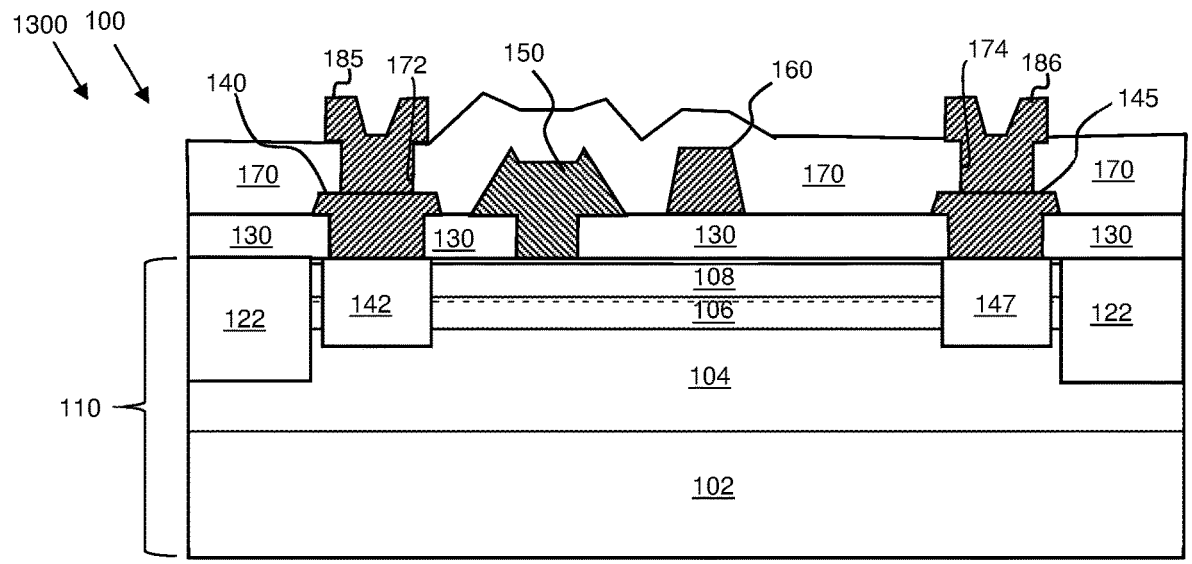
FIGS. 13A, 13B, and 13C are cross-sectional, side views of fabrication steps for producing a GaN HFET device, in accordance with embodiments of the method of fabrication.
Figure 13B:
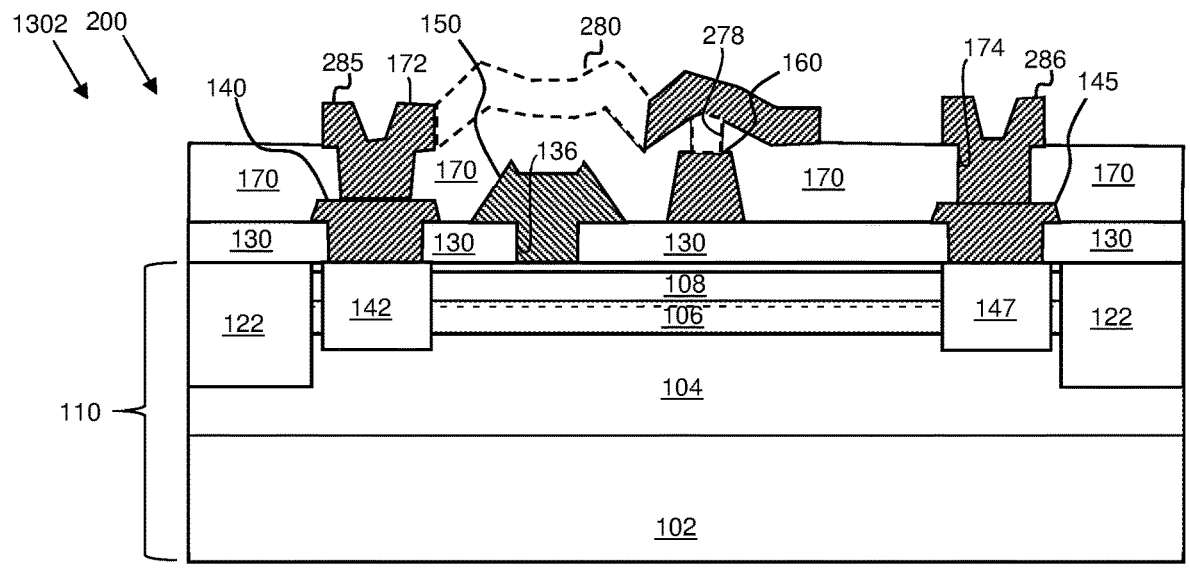
Figure 13C:
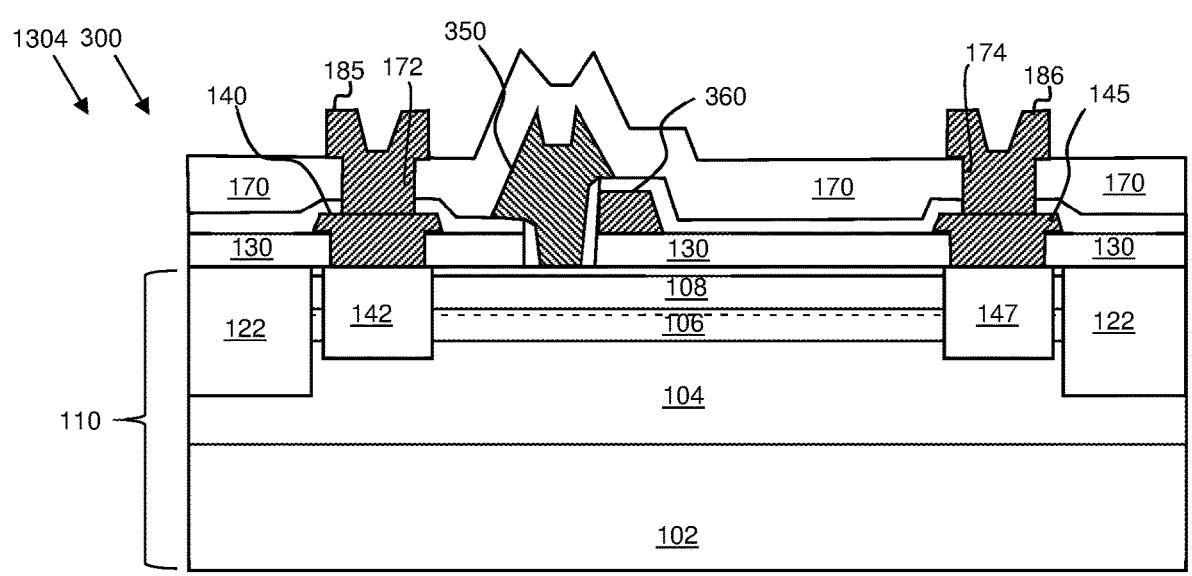

FIG. 13A depicts performing step 1300 described in the foregoing to realize the completed GaN HFET device 100 of FIG. 1. FIG. 13B depicts performing step 1302 to realize the completed GaN HFET device 200 of FIG. 2. FIG. 13C depicts performing step 1304, to realize the completed GaN HFET device 300 of FIG. 3.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
   a semiconductor substrate comprising an upper surface and a channel formed within an active region;
   a first dielectric layer disposed over the upper surface of the semiconductor substrate;
   a first current-carrying electrode and a second current-carrying electrode formed over the semiconductor substrate within the active region that includes a first conductive layer formed within first openings formed in the first dielectric layer, wherein the first current-carrying electrode and the second current-carrying electrode are electrically coupled to the channel;
   a control electrode formed over the semiconductor substrate within the active region and disposed between the first current-carrying electrode and the second current-carrying electrode, wherein the control electrode is electrically coupled to the channel through a vertical stem formed over the channel, wherein a protruding region is coupled to the vertical stem between the vertical stem and the second current-carrying electrode, wherein the protruding region directly contacts a dielectric film that contacts the semiconductor substrate, and wherein a lowermost surface of the protruding region directly contacts the dielectric film that contacts the dielectric surface; and
   a first conductive element that includes the first conductive layer, formed over the first dielectric layer, adjacent to the control electrode, and between the control electrode and the second current-carrying electrode within the active region.

2. The semiconductor device of claim 1, wherein a portion of the first current-carrying electrode is formed over the first dielectric layer.

3. The semiconductor device of claim 1, wherein a portion of the control electrode is formed above a portion of the first conductive element.

4. The semiconductor device of claim 1, further comprising a second conductive element formed between the first current-carrying electrode and the second current-carrying electrode, and over a second dielectric layer formed over the first dielectric layer and the control electrode, wherein the second conductive element is electrically coupled to the first conductive element, and wherein the second conductive element forms a second metal-insulator-semiconductor region in a vertical region between the first conductive element and the second current-carrying electrode that includes the second conductive element, the second dielectric layer, the first dielectric layer, and the semiconductor substrate.

5. The semiconductor device of claim 4, wherein the second conductive element forms a third metal-insulator-semiconductor region in a vertical region between the first conductive element and the control electrode that includes the second conductive element, the second dielectric layer, the first dielectric layer, and the semiconductor substrate.

6. The semiconductor device of claim 4, wherein the second conductive element is electrically coupled to the first conductive element through a via in the second dielectric layer above the first conductive element.

7. The semiconductor device of claim 1, further comprising a spacer layer formed adjacent the control electrode, wherein the spacer layer includes a first portion formed laterally adjacent a first vertical face of the control electrode nearer the first current-carrying electrode and a second portion formed laterally adjacent a second vertical face of the control electrode, nearer the second current-carrying electrode, wherein the first portion and the second portion are formed within a second opening formed in the first dielectric layer, and wherein the second portion is formed between the control electrode and the first conductive element.

8. The semiconductor device of claim 1, wherein a lateral distance between the control electrode and the first conductive element is between 0.1 micrometers and 1 micrometers.

9. The semiconductor device of claim 1, wherein the semiconductor substrate includes a group-III nitride layer.

10. The semiconductor device of claim 1, wherein the first current-carrying electrode is configured as a source electrode, the second current-carrying electrode is configured as a drain electrode, the control electrode is configured as a gate electrode, and the first conductive element is configured as a first field plate.

11. The semiconductor device of claim 1, wherein the first current-carrying electrode, the second current-carrying electrode, and the first conductive element have a same thickness.

12. The semiconductor device of claim 1, wherein the dielectric film that contacts the semiconductor substrate is the first dielectric layer.

13. The semiconductor device of claim 7, wherein the dielectric film that contacts the semiconductor substrate is the spacer layer.

14. A gallium nitride field effect transistor device comprising:
   a semiconductor substrate, comprising gallium nitride and further comprising an upper surface and a channel formed within an active region;
   a first dielectric layer disposed over the upper surface of the semiconductor substrate;
   a source electrode and a drain electrode formed over the semiconductor substrate within the active region that include a first conductive layer formed within source and drain openings formed in the first dielectric layer, wherein the source electrode and the drain electrode are electrically coupled to the channel;
   a gate electrode formed over the semiconductor substrate within the active region and disposed between the source electrode and the drain electrode, wherein the gate electrode is electrically coupled to the channel through a vertical stem formed over the channel, wherein a protruding region is coupled to the vertical stem between the vertical stem and the drain electrode, wherein the protruding region directly contacts a dielectric film that directly contacts the semiconductor substrate, and wherein a lowermost surface of the protruding region directly contacts the dielectric film that contacts the dielectric surface; and a first field plate that includes the first conductive layer, formed over the first dielectric layer, adjacent to the gate electrode between the gate electrode and the drain electrode within the active region, wherein the first field plate forms a first metal-insulator-semiconductor region in a vertical region between the gate electrode and the first field plate that includes the first field plate, the first dielectric layer, and the semiconductor substrate.

15. The gallium nitride field effect transistor device of claim 14, further comprising a spacer layer formed adjacent the gate electrode, wherein the spacer layer includes a first portion formed laterally adjacent a first vertical face of the gate electrode and a second portion formed laterally adjacent a second vertical face of the gate electrode, wherein the first portion and the second portion are formed within a gate opening formed in the first dielectric layer, and wherein a portion of the gate electrode is formed over the first field plate.

16. The gallium nitride field effect transistor device of claim 14, further comprising a second field plate formed between the source electrode and the drain electrode, and over a second dielectric layer formed over the first dielectric layer and the gate electrode, wherein the second field plate forms a second metal-insulator-semiconductor in a vertical region between the first field plate and the drain electrode that includes the second field plate, the second dielectric layer, the first dielectric layer, and the semiconductor substrate.

17. A method for forming a gallium nitride field effect transistor device comprising:
    forming a semiconductor substrate comprising gallium nitride and further comprising an upper surface and a channel;
    forming a first dielectric layer over the upper surface of the semiconductor substrate;
    forming a source electrode and a drain electrode, over the semiconductor substrate using a first conductive layer, within openings formed in the first dielectric layer;
    forming a first field plate using the first conductive layer over the first dielectric layer, between the source electrode and the drain electrode; and
    forming a gate electrode over the semiconductor substrate and between the source electrode and at least a portion of the first field plate, wherein forming the gate electrode includes forming a vertical stem over the channel and forming a protruding region coupled to the vertical stem between the vertical stem and the drain electrode, wherein the protruding region directly contacts a dielectric film that directly contacts the semiconductor substrate, and wherein a lowermost surface of the protruding region directly contacts the dielectric film that contacts the dielectric surface.

18. The method of claim 17, wherein the forming the source electrode and forming the first field plate include using the same masking step to pattern each the source electrode and the first field plate.

19. The method of claim 17, further comprising forming a spacer layer adjacent the gate electrode, adjacent a first vertical face and adjacent a second vertical face of the gate electrode and within an opening formed in the first dielectric layer.

20. The method of claim 19, wherein forming the spacer layer includes conformally depositing the spacer layer within the opening in the first dielectric layer and anisotropically etching the spacer layer to form a first portion that abuts the first vertical face of the gate electrode and to form a second portion that abuts the second vertical face of the gate electrode.

21. The method of claim 17, wherein a portion of the gate electrode is formed above a portion of the first field plate.

22. The method of claim 17, wherein forming the first field plate includes etching a material selected from the group consisting of titanium-aluminum, titanium-tungsten, and titanium-tungsten-nitride.

23. The method of claim 17, wherein forming the gate electrode includes etching an opening in the first dielectric layer, wherein an edge of the opening is defined by an edge of the first field plate.

24. The method of claim 17, further comprising forming a second field plate, over a second dielectric layer formed over the first dielectric layer and the gate electrode, wherein a portion of the second field plate is formed between the gate electrode and the first field plate.

* * * * *